United States Patent
Paek et al.

(10) Patent No.: US 10,712,483 B2
(45) Date of Patent: *Jul. 14, 2020

(54) PHOTOSENSITIVE COMPOSITIONS, QUANTUM DOT POLYMER COMPOSITE PATTERN PREPARED THEREFROM, AND ELECTRONIC DEVICES INCLUDING THE SAME

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Hojeong Paek, Suwon-si (KR); Shang Hyeun Park, Yongin-si (KR); Shin Ae Jun, Seongnam-si (KR); Jonggi Kim, Suwon-si (KR)

(73) Assignees: SAMSUNG ELECTRONICS CO., LTD., Gyeonggi-Do (KR); SAMSUNG SDI CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/244,596

(22) Filed: Aug. 23, 2016

(65) Prior Publication Data
US 2017/0059988 A1   Mar. 2, 2017

(30) Foreign Application Priority Data
Aug. 24, 2015 (KR) ........................ 10-2015-0119129

(51) Int. Cl.
*G03F 7/032*   (2006.01)
*G03F 7/004*   (2006.01)
(Continued)

(52) U.S. Cl.
CPC ............. *G02B 5/223* (2013.01); *G02B 5/201* (2013.01); *G02B 5/206* (2013.01); *G03F 7/0007* (2013.01);
(Continued)

(58) Field of Classification Search
CPC ........ G03F 7/033; G03F 7/0007; G03F 7/004; G03F 7/032; G02B 5/206; G02B 5/223;
(Continued)

(56) References Cited

U.S. PATENT DOCUMENTS 7,875,416 B2   1/2011   Park et al.
7,939,244 B2   5/2011   Xu et al.
(Continued)

FOREIGN PATENT DOCUMENTS

JP   2007-010796   *   1/2007
JP   2015-121702   *   7/2015   ............. G03F 7/038
(Continued)

OTHER PUBLICATIONS

Yoon et al.,"High luminescent efficiency white emitting diodes based on surface functionslized quatum dots dispersed in polymeric matrices", Coll. Surf. A,Physichem. Eng. Asp. vol. 428 pp. 86-91 (2013).*
(Continued)

*Primary Examiner* — Martin J Angebranndt
(74) *Attorney, Agent, or Firm* — Cantor Colburn LLP

(57) ABSTRACT

A photosensitive composition including: a plurality of quantum dots, wherein the quantum dot includes an organic ligand with a hydrophobic moiety bound to a surface of the quantum dot; a binder; a photopolymerizable monomer having a carbon-carbon double bond; a photoinitiator; and a solvent, wherein the binder includes a multiple aromatic ring-containing polymer including a main chain including a carboxylic acid group and a backbone structure incorporated (Continued)

in the main chain, wherein the backbone structure includes a quaternary carbon atom, which is a part of a cyclic group, and two aromatic rings bound to the quaternary carbon atom, and wherein the plurality of quantum dots are dispersed in the binder.

27 Claims, 10 Drawing Sheets

(51) Int. Cl.
    *G02B 5/22*     (2006.01)
    *G02B 5/20*     (2006.01)
    *B82Y 20/00*     (2011.01)
    *G03F 7/00*     (2006.01)

(52) U.S. Cl.
    CPC ............ *G03F 7/0047* (2013.01); *G03F 7/032* (2013.01); *B82Y 20/00* (2013.01); *G02B 2207/101* (2013.01)

(58) Field of Classification Search
    CPC ... G02B 5/201; G02B 2207/101; B82Y 20/00
    See application file for complete search history.

(56) References Cited

U.S. PATENT DOCUMENTS

| | | | | |
|---|---|---|---|---|
| 8,758,654 | B1* | 6/2014 | Uchikawa | G03F 7/0007 252/586 |
| 2005/0287445 | A1* | 12/2005 | Liu | G03F 1/50 430/5 |
| 2010/0104981 | A1* | 4/2010 | Choi | G03F 7/0007 430/286.1 |
| 2011/0201717 | A1* | 8/2011 | Held | C09J 4/00 522/33 |
| 2012/0001217 | A1* | 1/2012 | Kang | C08G 75/045 257/98 |
| 2014/0080061 | A1 | 3/2014 | Redinger et al. | |
| 2014/0158937 | A1* | 6/2014 | Jang | C09K 11/025 252/301.36 |
| 2015/0299501 | A1* | 10/2015 | Zhao | C09C 1/28 252/586 |
| 2016/0011506 | A1* | 1/2016 | Gu | G03F 7/027 430/288.1 |
| 2016/0178966 | A1* | 6/2016 | Li | G02B 5/20 349/71 |
| 2017/0176854 | A1* | 6/2017 | Park | G03F 7/0043 |
| 2017/0183565 | A1* | 6/2017 | Jun | C09K 11/025 |
| 2018/0044583 | A1* | 2/2018 | Kwon | C09K 11/562 |
| 2018/0044586 | A1* | 2/2018 | Kwon | H01L 33/34 |
| 2018/0105739 | A1* | 4/2018 | Kim | G03F 7/322 |
| 2018/0142149 | A1* | 5/2018 | Youn | C09K 11/025 |
| 2018/0173020 | A1* | 6/2018 | Chung | C09K 11/623 |
| 2018/0237690 | A1* | 8/2018 | Chung | G03F 7/162 |
| 2018/0239245 | A1* | 8/2018 | Yang | C09K 11/703 |
| 2018/0239247 | A1* | 8/2018 | Kwon | G03F 7/0752 |
| 2018/0299775 | A1* | 10/2018 | Kwon | G03F 7/0007 |
| 2019/0041747 | A1* | 2/2019 | Youn | C08K 5/3492 |
| 2019/0136126 | A1* | 5/2019 | Yang | G03F 7/322 |
| 2019/0278173 | A1* | 9/2019 | Kim | G03F 7/0007 |
| 2019/0278177 | A1* | 9/2019 | Jeong | G03F 7/038 |

FOREIGN PATENT DOCUMENTS

| | | | | |
|---|---|---|---|---|
| JP | 2015-125197 | * | 7/2015 | ............ G03F 7/004 |
| KR | 2009-0023982 A | | 3/2009 | |
| KR | 1435195 B1 | | 8/2014 | |
| KR | 2016-114292 | * | 10/2016 | ............... G02B 5/20 |
| WO | 2015/018154 | * | 2/2015 | |
| WO | 2016/134820 | * | 9/2016 | ............ G03F 7/075 |

OTHER PUBLICATIONS

Margita, "Monitoring and imaging hypoxic cells using perfluorinated near-infrared fluorescent micelles", 2012 NNIN REU Research accomplishments pp. 24-25 (2012).*

Mizuuchi et al., "High resolution cardo polymer dielectric VPA-series", IEEE 2002 Electron. Comp. Technol. Conf., pp. 924-930 (2002).*

Xie et al. "Colloidal INP nanocrystals as efficient emitters covering blue to near-infrared", JACS 129(50) pp. 15432-15433 (2007).*

Xie et al., "Formation of high-quality I-III-VI semiconductor nanocrystals by tuning relative reactivity of cationic precursors", JACS 131(15) pp. 5691-5697 (2009).*

\* cited by examiner

PHOTOSENSITIVE COMPOSITIONS, QUANTUM DOT POLYMER COMPOSITE PATTERN PREPARED THEREFROM, AND ELECTRONIC DEVICES INCLUDING THE SAME

CROSS-REFERENCE TO RELATED APPLICATIONS

This application claims priority to Korean Patent Application No. 10-2015-0119129 filed in the Korean Intellectual Property Office on Aug. 24, 2015, and all the benefits accruing therefrom under 35 U.S.C. § 119, the content of which is incorporated herein in its entirety by reference.

BACKGROUND

1. Field

A photosensitive composition, a production method thereof, and a quantum dot-polymer composite pattern prepared therefrom are disclosed.

2. Description of the Related Art

A liquid crystal display (hereinafter, LCD) is a display in which polarized light passes through a liquid crystal and then an absorption-type color filter to express a color. The LCD tends to suffer a problem of a narrow viewing angle and low luminance due to a low level of light transmittance of the absorption-type color filter.

Quantum dots (QD) are applicable for various display devices in the form of a composite. For example, QD composites including a polymer or an inorganic material may be used as a light conversion layer in a light emitting diode (LED). By colloidal synthesis, the particle size of the QDs may be relatively freely and uniformly controlled. The QDs having a size of less than or equal to about 10 nm may exhibit a more significant quantum confinement effect as their size decreases and thereby their bandgap increases. In this case, the energy density of the QDs may be enhanced.

For the application of the QDs in various devices, there remains a need to develop a technique for patterning the quantum dot-polymer composite.

SUMMARY

An embodiment is related to a photosensitive composition capable of preparing a pattern of a quantum dot-polymer composite.

Another embodiment is related to a production method of the aforementioned photosensitive composition.

Another embodiment is related to a quantum dot-polymer composite pattern prepared from the aforementioned photosensitive composition. Yet another embodiment provides a color filter including the quantum dot-polymer composite.

In an embodiment, a photosensitive composition includes:
a plurality of quantum dots;
a binder;
a photopolymerizable monomer having a carbon-carbon double bond; and
a photoinitiator,
wherein the binder includes a multiple aromatic ring-containing polymer including a carboxylic acid group and a main chain having a backbone structure incorporated in the main chain, wherein the backbone structure includes a quaternary carbon atom, which is a part of a cyclic group, and two aromatic rings bound to the quaternary carbon atom.

In the composition, the plurality of quantum dots may be dispersed by the binder to form a quantum dot dispersion.

The photosensitive composition may include the quantum dot dispersion including the binder and the plurality of the quantum dots dispersed in the binder.

In the binder, the carboxylic acid group is included in the main chain.

The quantum dot may include an organic ligand including a hydrophobic moiety bound to a surface of the quantum dot.

The carboxylic acid group may be bonded to the main chain of the multiple aromatic ring-containing polymer.

In some embodiments, the organic ligand does not include a photopolymerizable functional group.

The organic ligand with a hydrophobic moiety may include RCOOH, RNH$_2$, R$_2$NH, R$_3$N, RSH, R$_3$PO, R$_3$P, ROH, RCOOR', RPO(OH)$_2$, R$_2$POOH (wherein R and R' are each independently a C5 to C24 aliphatic hydrocarbon group or a C6 to C20 aromatic hydrocarbon group), a polymeric organic ligand, or a combination thereof.

The quantum dot may include a Group II-VI compound, a Group III-V compound, a Group IV-VI compound, a Group IV compound, a Group I-III-VI compound, a Group I-II-IV-VI compound, or a combination thereof.

The carboxylic acid group-containing binder may have an acid value of greater than or equal to about 50 milligrams of KOH per gram of the polymer.

The carboxylic acid group-containing binder may have an acid value between about 50 milligrams of KOH per gram of the polymer and about 150 milligrams of KOH per gram of the polymer.

The backbone structure of the multiple aromatic ring-containing polymer may include a structural unit represented by Chemical Formula 1:

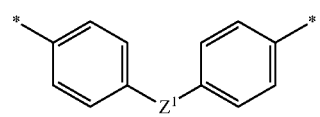

Chemical Formula 1 wherein in Chemical Formula 1,
* indicates a portion that is linked to an adjacent atom of the main chain of the binder,
Z$^1$ is a linking moiety represented by any one of Chemical Formulae 1-1 to 1-6, and in Chemical Formulae 1-1 to 1-6,
* indicates a portion that is linked to an aromatic moiety:

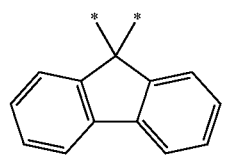

Chemical Formula 1-1

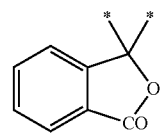

Chemical Formula 1-2

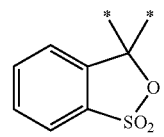

Chemical Formula 1-3

Chemical Formula 1-4

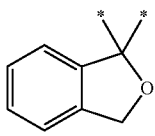

Chemical Formula 1-5

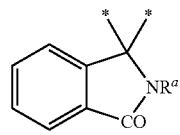

wherein in Chemical Formula 1-5,
$R^a$ is hydrogen, —$C_2H_5$, —$C_2H_4Cl$, —$C_2H_4OH$, —$CH_2CH=CH_2$, or a phenyl group, Chemical Formula 1-6

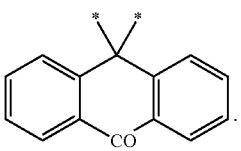

The multiple aromatic ring-containing polymer may include a repeating unit represented by Chemical Formula 2:

Chemical Formula 2

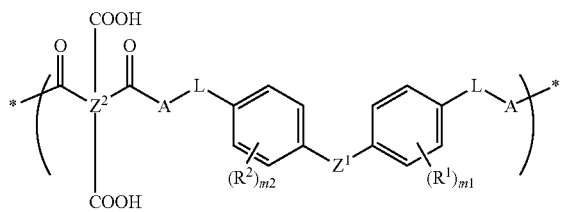

wherein in Chemical Formula 2,
$Z^1$ is a linking moiety represented by any one of Chemical Formulae 1-1 to 1-6, L is a single bond, a C1 to C10 alkylene group, a C1 to C10 alkylene group having a substituent including a carbon-carbon double bond, a C1 to C10 oxy alkylene group, or a C1 to C10 oxy alkylene group having a substituent including a carbon-carbon double bond, A is —NH—, —O—, or a C1 to C10 alkylene group, and
$Z^2$ is a C6 to C40 aromatic organic group.

In Chemical Formula 2,
$Z^2$ may be any one of Chemical Formula 2-1, Chemical Formula 2-2, and Chemical Formula 2-3:

Chemical Formula 2-1

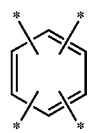

wherein in Chemical Formula 2-1,
* indicates a portion that is linked to an adjacent carbonyl carbon atom, Chemical Formula 2-2

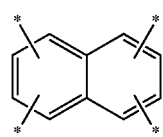

wherein in Chemical Formula 2-2,
* indicates a portion that is linked to an adjacent carbonyl carbon atom, Chemical Formula 2-3

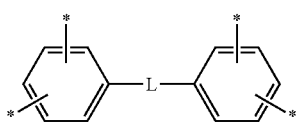

wherein Chemical Formula 2-3,
* indicates a portion that is linked to an adjacent carbonyl carbon atom, L is a single bond, —O—, —S—, —C(=O)—, —CH(OH)—, —S(=O)$_2$—, —Si(CH$_3$)$_2$—, (CH$_2$)$_p$ (wherein 1≤p≤10), (CF$_2$)$_q$ (wherein 1≤q≤10), —CR$_2$— (wherein each R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula 3:

Chemical Formula 3

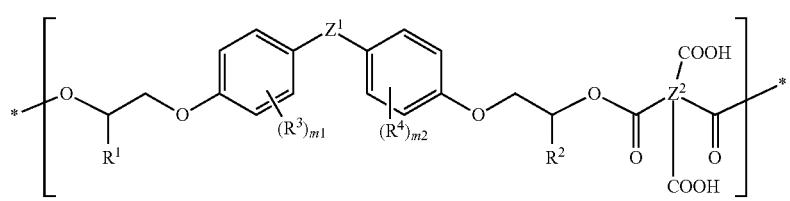

wherein in Chemical Formula 3,
each of $R^1$ and $R^2$ is independently hydrogen or a substituted or unsubstituted (meth)acryloyloxyalkyl group (wherein "alkyl" is a C1 to C20 alkyl group),
each of $R^3$ and $R^4$ is independently hydrogen, a halogen, or a substituted or unsubstituted C1 to C20 alkyl group,
$Z^1$ is independently a moiety selected from linking moieties represented by Chemical Formulae 1-1 to 1-6,
$Z^2$ is an aromatic organic as defined in Chemical Formula 2, and m1 and m2 are independently an integer ranging from 0 to 4.

The multiple aromatic ring-containing polymer may be an acid adduct of bisphenol fluorene epoxy acrylate.

The multiple aromatic ring-containing polymer may include a functional group represented by Chemical Formula 4 at one or both terminal ends:

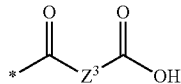

Chemical Formula 4 wherein in Chemical Formula 4, $Z^3$ is a moiety represented by one of Chemical Formulae 4-1 to 4-7:

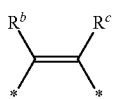

Chemical Formula 4-1 wherein Chemical Formula 4-1, each of $R^b$ and $R^c$ is independently hydrogen, a substituted or unsubstituted C1 to C20 alkyl group, a C2 to C20 ester group, or a C2 to C20 ether group.

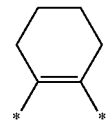

Chemical Formula 4-2

Chemical Formula 4-3

Chemical Formula 4-4

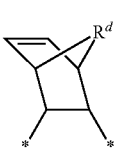

Chemical Formula 4-5 wherein in Chemical Formula 4-5, $R^d$ is O, S, NH, a substituted or unsubstituted C1 to C20 alkylene group, a C1 to C20 alkylamine group, or a C2 to C20 alkenylamine group.

Chemical Formula 4-6

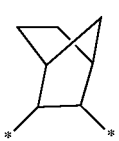

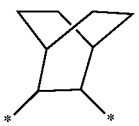

Chemical Formula 4-7

A weight average molecular weight of the multiple aromatic ring-containing polymer may be greater than or equal to about 1,000 grams per mole and less than or equal to about 50,000 grams per mole.

The photosensitive composition may be developable by an alkali aqueous solution.

The photosensitive composition may further include a solvent and it may include, based on a total weight of the composition:

about 1 percent by weight to about 40 percent by weight of the quantum dots;

about 0.5 percent by weight to about 35 percent by weight of the carboxylic acid group-containing binder;

about 0.5 percent by weight to about 30 percent by weight of the photopolymerizable monomer;

about 0.01 percent by weight to about 10 percent by weight of the photoinitiator; and a balance amount of the solvent.

The photosensitive composition may further include a light diffusing agent selected from a metal oxide particle, a metal particle, and a combination thereof.

The photosensitive composition may further include a dispersant.

The composition may further include a thiol compound represented by Chemical Formula 5:

Chemical Formula 5 wherein in Chemical Formula 5, $R^1$ is selected from hydrogen, a substituted or unsubstituted C1 to C30 linear or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are each independently hydrogen or a C1 to C30 linear or branched alkyl group), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted alkylene group and X is a halogen), —C(=O)OR' (wherein R' is hydrogen or a C1 to C20 linear or branched alkyl group), —CN, or —C(=O)ONRR' (wherein R and R' are each independently hydrogen or a C1 to C20 linear or branched alkyl group), $L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—$CH_2$—) groups of the substituted or unsubstituted C1 to C30 alkylene group may be replaced by a sulfonyl group (—$SO_2$—), a carbonyl group (CO), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, a C1 to C30 alkylene group or a C2 to C30 alkenylene group wherein at least one methylene (—CH$_2$—) group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond and provided that the sum of k1 and k2 does not exceed the valence of $L_1$.

The amount of the thiol compound may be between about 0.1 percent by weight and about 40 percent by weight, based on a total weight of the composition.

In another embodiment, a production method of the aforementioned photosensitive composition includes:

providing a binder solution including the binder and a solvent;

combining a plurality of the quantum dots, wherein the quantum dot includes having an organic ligand bound to a surface of the quantum dot with the binder solution to obtain a quantum dot-binder dispersion; and combining the quantum dot-binder dispersion with at least one selected from a reactive compound having at least two thiol groups, a photopolymerizable monomer having a carbon-carbon double bond, a photoinitiator, a solvent, and a combination thereof.

In another embodiment, a pattern of a quantum dot-polymer composite includes:

a plurality of quantum dots wherein the quantum dot includes an organic ligand including a hydrophobic moiety on (e.g., bound to) a surface of the quantum dot;

a binder; and a polymerization product of a photopolymerizable monomer having a carbon-carbon double bond, wherein the binder includes a multiple aromatic ring-containing polymer including a carboxylic acid group and a main chain having a backbone structure incorporated in the main chain, wherein the backbone structure includes a quaternary carbon atom, which is a part of a cyclic group, and two aromatic rings bound to the quaternary carbon atom, and wherein the plurality of quantum dots are dispersed in the binder and the polymerization product of the photopolymerizable monomer.

The organic ligand may include RCOOH, RNH$_2$, R$_2$NH, R$_3$N, RSH, R$_3$PO, R$_3$P, ROH, RCOOR', RPO(OH)$_2$, R$_2$POOH (wherein R and R' are each independently a C5 to C24 aliphatic hydrocarbon group or a C6 to C20 aromatic hydrocarbon group), a polymeric organic ligand, or a combination thereof.

The quantum dot may include a Group II-VI compound, a Group III-V compound, a Group IV-VI compound, a Group IV element or compound, a Group I-III-VI compound, a Group I-II-IV-VI compound, or a combination thereof.

The multiple aromatic ring-containing polymer may have an acid value of greater than or equal to about 50 milligrams of KOH per gram of the polymer.

The backbone structure of the multiple aromatic ring-containing polymer may include a structural unit represented by Chemical Formula 1:

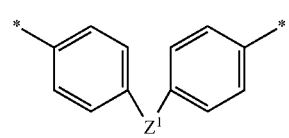

Chemical Formula 1 wherein in Chemical Formula 1,

* indicates a portion that is linked to an adjacent atom of the main chain of the binder, $Z^1$ is a linking moiety represented by any one of Chemical Formulae 1-1 to 1-6, and in Chemical Formulae 1-1 to 1-6, and

* indicates a portion that is linked to an aromatic moiety:

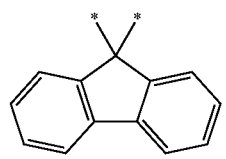

Chemical Formula 1-1

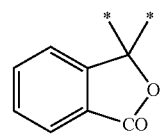

Chemical Formula 1-2

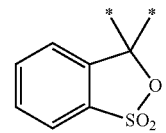

Chemical Formula 1-3

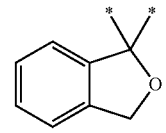

Chemical Formula 1-4

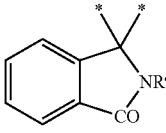

Chemical Formula 1-5 wherein in Chemical Formula 1-5, $R^a$ is hydrogen, —C$_2$H$_5$, —C$_2$H$_4$Cl, —C$_2$H$_4$OH, —CH$_2$CH=CH$_2$, or a phenyl group, Chemical Formula 1-6

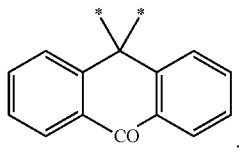

The multiple aromatic ring-containing polymer may include a repeating unit represented by Chemical Formula 2:

Chemical Formula 2

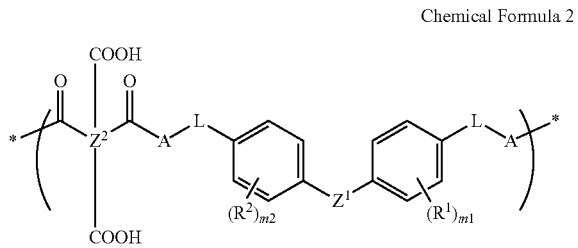

wherein in Chemical Formula 2, $Z^1$ is a linking moiety represented by any one of Chemical Formulae 1-1 to 1-6, L is a single bond, a C1 to C10 alkylene group, a C1 to C10 alkylene group having a substituent including a carbon-carbon double bond, a C1 to C10 oxy alkylene group, or a C1 to C10 oxy alkylene group having a substituent including a carbon-carbon double bond, A is —NH—, —O—, or a C1 to C10 alkylene group, and $Z^2$ is a C6 to C40 aromatic organic group.

In Chemical Formula 2, $Z^2$ may be any one of Chemical Formula 2-1,

Chemical Formula 2-2, and Chemical Formula 2-3:

Chemical Formula 2-1

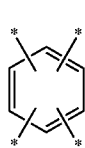

wherein in Chemical Formula 2-1,

* indicates a portion that is linked to an adjacent carbonyl carbon atom,

Chemical Formula 2-2

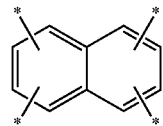

wherein in Chemical Formula 2-2,

* indicates a portion that is linked to an adjacent carbonyl carbon atom,

Chemical Formula 2-3

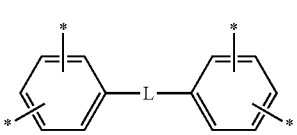

wherein in Chemical Formula 2-3,

* indicates a portion that is linked to an adjacent carbonyl carbon atom, L is a single bond, —O—, —S—, —C(=O)—, —CH(OH)—, —S(=O)$_2$—, —Si(CH$_3$)$_2$—, (CH$_2$)$_p$ (wherein 1≤p≤10), (CF$_2$)$_q$ (wherein 1≤p≤10), —CR$_2$— (wherein each R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula 3:

Chemical Formula 3

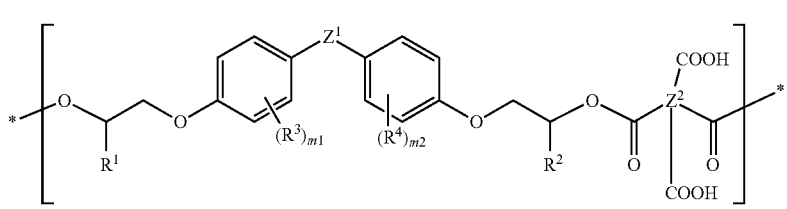

wherein in Chemical Formula 3, each of $R^1$ and $R^2$ is independently hydrogen or a substituted or unsubstituted (meth)acryloyloxyalkyl group (wherein "alkyl" is a C1 to C20 alkyl group), each of $R^3$ and $R^4$ is independently hydrogen, a halogen, or a substituted or unsubstituted C1 to C20 alkyl group, $Z^1$ is independently a moiety selected from linking moieties represented by Chemical Formulae 1-1 to 1-6, $Z^2$ is an aromatic organic group as defined in Chemical Formula 2, and m1 and m2 are independently an integer ranging from 0 to 4.

The multiple aromatic ring-containing polymer may be an acid adduct of bisphenol fluorene epoxy acrylate.

The multiple aromatic ring-containing polymer may include a functional group represented by Chemical Formula 4 at one or both terminal ends:

Chemical Formula 4

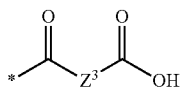

wherein in Chemical Formula 4, $Z^3$ is a moiety represented by one of Chemical Formulae 4-1 to 4-7:

Chemical Formula 4-1

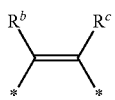

wherein in Chemical Formula 4-1, each of $R^b$ and $R^c$ is independently hydrogen, a substituted or unsubstituted C1 to C20 alkyl group, a C2 to C20 ester group, or a C2 to C20 ether group.

Chemical Formula 4-2

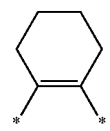

Chemical Formula 4-3

Chemical Formula 4-4

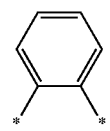

Chemical Formula 4-5

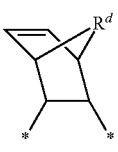

wherein in Chemical Formula 4-5, $R^d$ is O, S, NH, a substituted or unsubstituted C1 to C20 alkylene group, a C1 to C20 alkylamine group, or a C2 to C20 alkenylamine group.

Chemical Formula 4-6

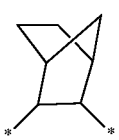

Chemical Formula 4-7

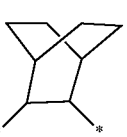

A weight average molecular weight of the multiple aromatic ring-containing polymer may be greater than or equal to about 1000 grams per mole and less than or equal to about 50,000 grams per mole.

The photosensitive composition may further include a light diffusing agent selected from a metal oxide particle, a metal particle, and a combination thereof.

The photosensitive composition may further include a dispersant.

Another embodiment provides a color filter including a quantum dot-polymer composite pattern prepared from the photosensitive composition.

The aforementioned photosensitive composition may provide a quantum dot-polymer composite pattern in an environmentally friendly manner. The photosensitive composition of the embodiments may be utilized in a conventional photo-resist process without any additional surface treatment for the quantum dots.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
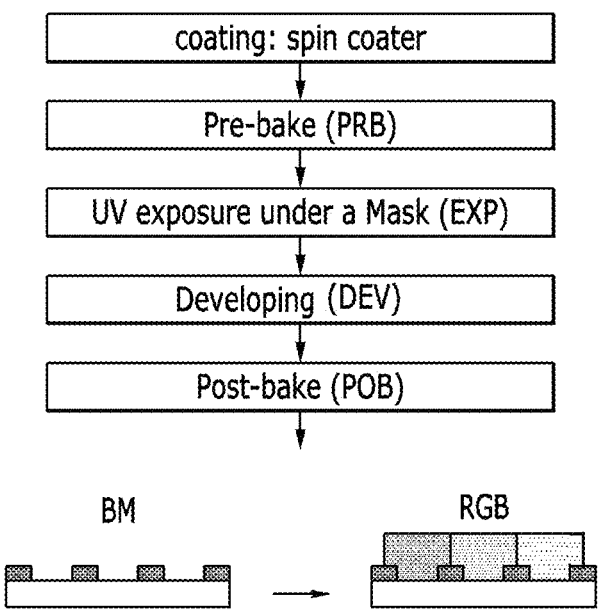
FIG. 1 is a view schematically illustrating a pattern forming process according to an embodiment to explain critical dimension uniformity.

Advantages and characteristics of this disclosure, and a method for achieving the same, will become evident referring to the following exemplary embodiments together with the drawings attached hereto. The embodiments, may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "includes" or "including" and/or "comprises" or "comprising" when used in the specification or claims will be understood to imply the inclusion of stated features, regions, integers, steps, operations, elements, and/or components. but not the exclusion of any other features, regions, integers, steps, operations, elements, and/or components.

Accordingly, the embodiments are merely described below, by referring to the figures, to explain aspects of the present description. As used herein, the term "and/or" includes any and all combinations of one or more of the associated listed items. The term "or" means "and/or." Expressions such as "at least one of" when preceding a list of elements, modify the entire list of elements and do not modify the individual elements of the list.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Further, the singular includes the plural unless mentioned otherwise.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, "mixture" as used herein is inclusive of all types of combinations, including blends, alloys, solutions, and the like.

As used herein, when a definition is not otherwise provided, the term "combination thereof" refers to a mixture, a stacked structure, a composite, an alloy, a blend, a reaction product, or the like.

As used herein, when a definition is not otherwise provided, the term "substituted" refers to a compound wherein at least one of hydrogen atoms thereof is substituted with a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, when a definition is not otherwise provided, the term "alkyl group" refers to a group derived from a straight or branched chain saturated aliphatic hydrocarbon having the specified number of carbon atoms and having a valence of at least one.

As used herein, when a definition is not otherwise provided, the term "alkoxy group" refers to "alkyl-O—", wherein the term "alkyl" has the same meaning as described above.

As used herein, when a definition is not otherwise provided, the term "alkenyl group" refers to a straight or branched chain, monovalent hydrocarbon group having at least one carbon-carbon double bond.

As used herein, when a definition is not otherwise provided, the term "alkynyl group" refers to a straight or branched chain, monovalent hydrocarbon group having at least one carbon-carbon triple bond.

As used herein, when a definition is not otherwise provided, the term "cycloalkyl group" refers to a monovalent group having one or more saturated rings in which all ring members are carbon.

As used herein, when specific definition is not otherwise provided, the term "cycloalkenyl group" refers to a monovalent group having one or more rings and one or more carbon-carbon double bond in the ring, wherein all ring members are carbon.

As used herein, when specific definition is not otherwise provided, the term "cycloalkynyl group" refers to a monovalent group having one or more rings and one or more carbon-carbon triple bond in the ring, wherein all ring members are carbon.

As used herein, when specific definition is not otherwise provided, the term "acyl group" refers to "alkyl-C(=O)—", wherein the term "alkyl" has the same meaning as described above.

As used herein, when a definition is not otherwise provided, the term "heterocycloalkyl group" refers to a cycloalkyl group as defined above, wherein 1 to 3 carbon atoms are replaced with heteroatoms selected from N, O, S, Si, and P.

As used herein, when a definition is not otherwise provided, the term "aryl", which is used alone or in combination, refers to an aromatic hydrocarbon group containing at least one ring and having the specified number of carbon atoms. The term "aryl" may be construed as including a group with an aromatic ring fused to at least one cycloalkyl ring.

As used herein, when a definition is not otherwise provided, the term "heteroaryl group" refers to an aryl group including carbon and 1 to 3 heteroatoms selected from the group consisting of N, O, S, and P as ring atoms.

As used herein, when a definition is not otherwise provided, the term "arylalkyl group" refers to a substituted or unsubstituted aryl group covalently linked to an alkyl group that is linked to a compound.

As used herein, when a definition is not otherwise provided, the term "heteroarylalkyl group" refers to a substituted or unsubstituted heteroaryl group covalently linked to an alkyl group that is linked to a compound.

As used herein, when a definition is not otherwise provided, the term "alkylene group" refers to a straight or branched saturated aliphatic hydrocarbon group having a valence of at least two, optionally substituted with one or more substituents.

As used herein, when a definition is not otherwise provided, the term "arylene group" refers to a functional group having a valence of at least two obtained by removal of two hydrogens in an aromatic ring, optionally substituted with one or more substituents.

As used herein, when a definition is not otherwise provided, the term "heteroarylene group" refers to a functional group having a valence of at least two obtained by removal of two hydrogens in an aromatic ring, containing one to three heteroatoms selected from the group consisting of N, O, S, Si, and P as ring-forming elements, optionally substituted with one or more substituents where indicated, provided that the valence of the alkylene group is not exceeded.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C30 alkyl" refers to a C1 to C30 alkyl group substituted with a C6 to C30 aryl group, the total number of carbon atoms in the resulting aryl substituted alkyl group is C7 to C60.

As used herein, when a definition is not otherwise provided, the term "aliphatic organic group" refers to a C1 to C30 linear or branched alkyl group, the term "aromatic organic group" refers to a C6 to C30 aryl group or a C2 to C30 heteroaryl group, and the term refers to a "alicyclic organic group" refers to a C3 to C30 cycloalkyl group, a C3 to C30 cycloalkenyl group, and a C3 to C30 cycloalkynyl group.

As used herein, when a definition is not otherwise provided, the term "(meth)acrylate" refers to acrylate and/or methacrylate.

As used herein, when a definition is not otherwise provided, the term "hydrophobic moiety" refers to a moiety that causes a given compound including the same to show agglomeration in an aqueous solution and to have a tendency to repel water. For example, the hydrophobic moiety may include an aliphatic hydrocarbon group having a carbon number of greater than or equal to 2 (an alkyl group, an alkenyl group, an alkynyl group, etc.), an aromatic hydrocarbon group having a carbon number of greater than or equal to 6 (a phenyl group, a naphthyl group, an aralkyl group, etc.), or an alicyclic hydrocarbon group having a carbon number of greater than or equal to 5 (a cyclohexyl group, a norbornyl group, etc.). The hydrophobic moiety substantially lacks an ability to make a hydrogen bond with an ambient medium and is not substantially mixed with the medium as its polarity is not matched with that of the medium.

As used herein, when a definition is not otherwise provided, the term "visible light" refers to light having a wavelength of about 390 nanometers (nm) to about 700 nm. As used herein, the term "UV light" refers to light having a wavelength of greater than or equal to about 200 nm and less than about 390 nm.

As used herein, the term "group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Ru, and Cs, but are not limited thereto.

As used herein, "Group V" refers to Group VA, and examples may include N, P, As, Sb, and Bi, but are not limited thereto.

As used herein, "Group VI" refers to Group VIA, and examples may include S, Se, and Te, but are not limited thereto.

As used herein, the term "dispersion" refers to a dispersion wherein a dissolved or dispersed phase includes a solid and a continuous phase includes a liquid.

As used herein, the term "dispersion" may refer to a colloidal dispersion wherein the dissolved or dispersed phase has a dimension of about 1 nm to about 1 um.

In an embodiment, a photosensitive composition includes:
a plurality of quantum dots, wherein the quantum dot includes an organic ligand bound to a surface of the quantum dot;
a carboxylic acid group (—COOH)-containing binder;
a photopolymerizable monomer having a carbon-carbon double bond;
a photoinitiator; and
a solvent.

The carboxylic acid group-containing binder includes a multiple aromatic ring-containing polymer that includes a carboxylic acid group and a main chain containing a backbone (i.e., skeleton) structure incorporated in the main chain. The carboxylic acid group may be included in the main chain. In the backbone structure, two aromatic rings are bound to a quaternary carbon atom that is a constituent atom of another cyclic moiety. The plurality of quantum dots are dispersed (e.g., separated from one another) in the binder. The multiple aromatic ring-containing polymer may include a linear polymer. The quantum dot dispersion may further include a solvent.

The quantum dot (hereinafter also referred to as a semiconductor nanocrystal) is not particularly limited, and may be prepared by any known method or may be commercially available. For example, the quantum dot may be a Group II-VI compound, a Group III-V compound, a Group IV-VI compound, a Group IV element or compound, a Group I-III-VI compound, a Group I-II-IV-VI compound, or a combination thereof.

The Group II-VI compound may be selected from:

a binary element compound selected from CdSe, CdTe, ZnS, ZnSe, ZnTe, ZnO, HgS, HgSe, HgTe, MgSe, MgS, and a combination thereof;

a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group II-VI compound may further include a Group III metal.

The Group III-V compound may be selected from:

a binary element compound selected from GaN, GaP, GaAs, GaSb, AlN, AlP, AlAs, AlSb, InN, InP, InAs, InSb, and a combination thereof;

a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compound may further include a Group II metal (InZnP).

The Group IV-VI element or compound may be selected from:

a binary element compound selected from SnS, SnSe, SnTe, PbS, PbSe, PbTe, and a combination thereof;

a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

Examples of the Group I-III-VI compound may include CuInSe$_2$, CuInS$_2$, CuInGaSe, and CuInGaS, but are not limited thereto. Examples of the Group I-II-IV-VI compound may include CuZnSnSe and CuZnSnS, but are not limited thereto.

The Group IV element or compound may include:

a single-element compound selected from Si, Ge, and a combination thereof; and a binary element compound selected from SiC, SiGe, and a combination thereof.

The binary element compound, the ternary element compound or the quaternary element compound, respectively, may either be in a uniform concentration within the particle or in a partially different concentration within the single particle. The semiconductor nanocrystal particle may have a core-shell structure wherein a first semiconductor nanocrystal is surrounded by a second semiconductor nanocrystal that is different from the first semiconductor nanocrystal. The interface between the core and the shell may have a concentration gradient wherein the concentration of an element of the shell decreases toward the core. In addition, the semiconductor nanocrystal particle may have a semiconductor nanocrystal core and a multi-layered shell surrounding the semiconductor nanocrystal core. The core and multi-layered shell structure have at least two layers of the shell wherein each layer may be a single composition, an alloy, or the one having a concentration gradient.

In the semiconductor nanocrystal particle, the materials of the shell may have a larger energy bandgap than that of the core, and thereby the semiconductor nanocrystal may exhibit a quantum confinement effect more effectively. In case of a multi-layered shell type of a semiconductor nanocrystal particle, the bandgap of the material of an outer layer of the shell may be of higher energy than that of the material of an inner layer of the shell (a layer that is closer to the core). In this case, the semiconductor nanocrystal particle may emit light of a UV to infrared wavelength range.

The semiconductor nanocrystal may have a quantum yield of greater than or equal to about 10%, or greater than or equal to about 30%, for example, greater than or equal to about 50%, greater than or equal to about 60%, greater than or equal to about 70%, or greater than or equal to about 90%.

For use in display devices, the semiconductor nanocrystal may have a narrower FWHM so as to realize enhanced color purity or color reproducibility. The semiconductor nanocrystal may have a FWHM of less than or equal to about 45 nanometers (nm), for example less than or equal to about 40 nm, or less than or equal to about 30 nm. While not wishing to be bound by theory, it is understood that within such ranges, a device including the nanocrystal may have enhanced color purity or improved color reproducibility.

The quantum dot may have a particle diameter (e.g., corresponding to the longest size for a non-spherically shaped particle) of about 1 nm to about 100 nm. For example, the quantum dot may have a particle diameter (the longest diameter for a non-spherically shaped particle) of about 1 nm to about 20 nm, for example, from 2 nm (or from 3 nm) to 15 nm.

The quantum dot may have a shape that is widely used in the art and is not particularly limited. For example, the quantum dot may include spherical, pyramidal, multi-armed, or cubic nanoparticles, nanotubes, nanowires, nanofibers, nanoplate particles, a combination thereof, or the like.

The quantum dot is commercially available or may be synthesized by any method. For example, several nano-sized quantum dots may be synthesized according to a wet chemical process. In the wet chemical process, precursors react in an organic solvent to grow nanocrystal particles, and the organic solvent or a ligand compound may coordinate to the surface of the semiconductor nanocrystal, controlling the growth of the nanocrystal. Examples of the organic solvent and the ligand compound are known in the art. The organic solvent coordinated on the surface of the quantum dot may affect stability of a device, and thus excess organic materials that are not coordinated on the surface of the quantum dot may be removed by pouring it in an excessive amount of a non-solvent, and centrifuging the resulting mixture. Examples of the non-solvent may be acetone, ethanol, methanol, and the like, but are not limited thereto. After the removal of extra organic materials, the amount of the organic materials coordinated on the surface of the quantum dots may be less than or equal to about 50% by weight (wt %), for example, less than or equal to about 30 wt %, less than or equal to about 20 wt %, or less than or equal to about 10 wt %, based on the total weight of the quantum dots. The organic material may include a ligand compound, an organic solvent, or a combination thereof.

The quantum dot may have an organic ligand with a hydrophobic moiety bonded to a surface thereof. In an embodiment, the organic ligand with a hydrophobic moiety may include RCOOH, RNH$_2$, R$_2$NH, R$_3$N, RSH, R$_3$PO, R$_3$P, ROH, RCOOR', RPO(OH)$_2$, R$_2$POOH (wherein R and R' are each independently a C5 to C24 alkyl group, a C5 to C24 alkenyl group, or a C6 to C20 aryl group), a polymeric organic ligand, or a combination thereof.

Examples of the organic ligand compound on the surface of the quantum dot may include thiols such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acids such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphines such as methyl phosphine, ethyl phosphine, propyl phosphine, butyl phosphine, pentyl phosphine, octylphosphine, dioctyl phosphine, tributylphosphine, or trioctylphosphine; phosphine oxides such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide; diphenyl phosphine, triphenyl phosphine, or oxides thereof; C5 to C20 alkyl phosphinic acids such as hexylphosphinic acid, octylphosphinic acid, dodecanephosphinic acid, tetradecanephosphinic acid, hexadecanephosphinic acid, or octadecanephosphinic acid; and the like, but are not limited thereto. The quantum dot may include the hydrophobic organic ligand alone or as a combination of two or more ligands.

An amount of the quantum dot including the hydrophobic organic ligand may be greater than or equal to about 1 wt %, for example, greater than or equal to about 5 wt %, or greater than or equal to about 10 wt %, based on the total amount of the composition. The amount of the quantum dot including the hydrophobic organic ligand may be less than or equal to about 40 wt %, for example, less than or equal to about 35 wt %, based on the total amount of the composition. In the embodiments, the amount of the quantum dot including the hydrophobic organic ligand may be greater than or equal to about 5 wt % and less than or equal to about 15 wt %, based on the total weight of the solid content (i.e., the non-volatile component).

The photosensitive composition includes the carboxylic acid group containing binder, and thereby the plurality of the quantum dots may be dispersed (e.g., separated from each other) in the binder. The carboxylic acid group containing binder has a skeleton structure in its main chain where two aromatic rings are bound to a quaternary carbon atom that is a constituent atom of another cyclic moiety, and includes a carboxylic acid group that is bound to the main chain. The photosensitive composition of the embodiments may provide a quantum dot-polymer composite pattern even when the quantum dots that have no photopolymerizable functional group (e.g., a carbon-carbon double bond containing group, such as (meth)acrylate). Therefore, the patterning process may omit the surface treatment of the quantum dots and may not use an organic solvent during a developing stage.

Using a photoluminescent type of color filter instead of the absorption type of color filter may widen the viewing angle and improve the luminance. The quantum dot may have a theoretical quantum yield (QY) of about 100%, and may emit light having high color purity (e.g., a full width at half maximum (FWHM) of less than or equal to about 40 nm) and thus it may accomplish the enhanced luminous efficiency and the improved color reproducibility. Accordingly, it is believed that using a color filter including a quantum dot polymer composite may realize a display having high brightness, a wide viewing angle, and high color reproducibility. However, developing of the pattern forming technology for the quantum dot polymer composite has many difficulties due to the intrinsic properties of the quantum dot (e.g., poor compatibility with the polymer, difficulties in dispersion, and the like).

As a method of forming a pattern including quantum dots in conventional arts, U.S. Pat. No. 7,199,393, the entire contents of which are incorporated herein by reference, discloses that quantum dots having a photosensitive functional group on the surface are used in a patterning method. In the disclosed method, a photosensitive functional group is introduced onto the surface of a quantum dot and then is subjected to photopolymerization, if desired, together with a photopolymerizable monomer, to prepare a quantum dot-polymer composite pattern. But the disclosed method requires an additional process of a surface treatment of quantum dots and needs to use an organic solvent to form a pattern during a developing process.

On the other hand, when quantum dots (e.g., in which organic ligand is bound to the surface) are mixed with the alkali-developable photoresist without performing any surface treatment in an attempt to provide an alkali-developable quantum dot-polymer composite pattern, they are not dispersed well or are even agglomerated because the quantum dots have poor compatibility with the conventional photoresist. In order for the patterned quantum dot-polymer composite to be utilized in a color filter, a relatively large amount (e.g., at least 5 wt %, based on the total weight of the composition) of quantum dots should be able to be included in the composite. However, as the quantum dots have poor compatibility with a medium, such as the polymer, it is very difficult to add a desired amount of the quantum dots to the polymer matrix.

Surprisingly, the inventors have found that when the quantum dot including an organic ligand with a hydrophobic moiety on (e.g., bound to) the surface of the quantum dot is first dispersed in the solution of the carboxylic acid group-containing binder having the aforementioned skeleton structure, and then the obtained quantum dot-binder dispersion is mixed with the other components for a photoresist, the quantum dots may be well dispersed in the alkali-developable photoresist. Even a relatively large amount of the quantum dots may be dispersed well in the photoresist composition.

Without wishing to be bound by any theory, when the quantum dots are dispersed in the solution of the carboxylic acid group-containing binder having a hydrophobic moiety, the binder may facilitate the formation of the dispersion including the quantum dots, and the quantum dots dispersed with the help of the binder may maintain their dispersed state even when they constitute a photoresist composition.

The pattern forming process using a photoresist involves developing a pattern using a developer solution (e.g., an alkaline developer solution), and heating (e.g., post-baking) the pattern in order to enhance the adhesion to the substrate, improve a shape of the pattern, and make the obtained pattern harder. In order to form a color filter pattern using the photoresist, the pattern may have to maintain a predetermined thickness (e.g., about 3 micrometers (um) to about 4 um), to have a round shape cross-section without an undercut. The uniform R, G, and B pattern on the black matrix may form a color filter capable of emitting light without bending or scattering of light. However, the quantum dots are known to have poor compatibility with the conventional photoresist and they also absorb a substantial amount of incident light. Therefore, the pattern prepared from the photoresist including the quantum dots tend to show a serious undercut phenomenon, and waste residue of the photoresist easily occurs.

In contrast, using the quantum dot together with the aforementioned COOH containing polymer binder having the foregoing skeleton structure may resolve the problems of the undercuts in the prepared pattern. Without wishing to be bound by any theory, the aforementioned COOH containing polymer binder has a relative low value of glass transition temperature (a temperature of 100° C. or lower or a temperature of about 50° C. or lower). Therefore, the pattern may have melting properties during a post baking process carried out at a temperature of about 180° C. to about 230° C. and thereby may control the shape of the pattern cross-section.

In the embodiments, the backbone structure of the multiple aromatic ring-containing polymer of the carboxylic acid group containing polymer binder may include a structural unit represented by Chemical Formula 1:

Chemical Formula 1

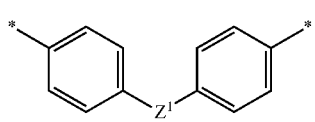

wherein in Chemical Formula 1,

* indicates a portion that is linked to an adjacent atom of the main chain of the binder, $Z^1$ is a linking moiety represented by any one of Chemical Formulae 1-1 to 1-6, and in Chemical Formulae 1-1 to 1-6, wherein in Chemical Formulae 1-1 to 1-6, * indicates a portion that is linked to an aromatic moiety:

Chemical Formula 1-1

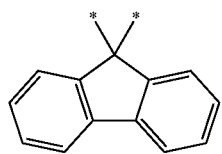

Chemical Formula 1-2

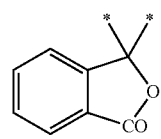

Chemical Formula 1-3

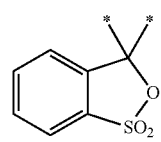

Chemical Formula 1-4

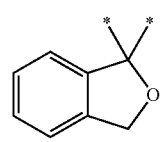

Chemical Formula 1-5

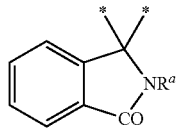

wherein in Chemical Formula 1-5, $R^a$ is hydrogen, $-C_2H_5$, $-C_2H_4Cl$, $-C_2H_4OH$, $-CH_2CH=CH_2$, or a phenyl group, Chemical Formula 1-6

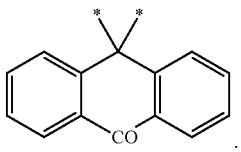

The multiple aromatic ring-containing polymer may include a repeating unit represented by Chemical Formula 2:

Chemical Formula 2

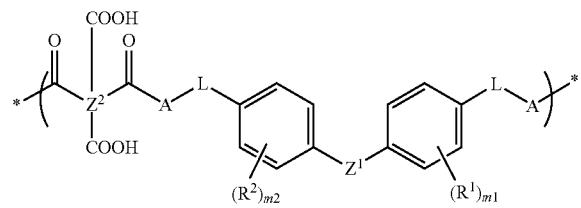

wherein in Chemical Formula 2, $Z^1$ is a linking moiety represented by any one of Chemical Formulae 1-1 to 1-6 (e.g., a fluorenyl group represented by Chemical Formula 1-1), L is a single bond, a C1 to C10 alkylene group, a C1 to C10 alkylene group having a substituent including a carbon-carbon double bond (e.g., CHR=CH—, a substituted or unsubstituted (meth)acryloyloxyalkyl group (wherein "alkyl" is a C1 to C20 alkyl group), or a combination thereof), a C1 to C10 oxy alkylene group (—OR—), or a C1 to C10 oxy alkylene group having a substituent including a carbon-carbon double bond (e.g., CHR=CH—, a substituted or unsubstituted (meth)acryloyloxyalkyl group (wherein "alkyl" is a C1 to C20 alkyl group), or a combination thereof), A is —NH—, —O—, or a C1 to C10 alkylene, and $Z^2$ is a C6 to C40 aromatic organic group.

In Chemical Formula 2, $Z^2$ may be any one of Chemical Formula 2-1, Chemical Formula 2-2, and Chemical Formula 2-3:

Chemical Formula 2-1

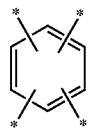

wherein in Chemical Formula 2-1,
* indicates a portion that is linked to an adjacent carbonyl carbon atom,

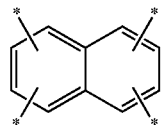

Chemical Formula 2-2 wherein in Chemical Formula 2-2,
* indicates a portion that is linked to an adjacent carbonyl carbon atom,

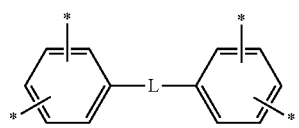

Chemical Formula 2-3 wherein in Chemical Formula 2-3,
* indicates a portion that is linked to an adjacent carbonyl carbon atom, L is a single bond, —O—, —S—, —C(=O)—, —CH(OH)—, —S(=O)$_2$—, —Si(CH$_3$)$_2$—, (CH$_2$)$_p$ (wherein 1≤p≤10), (CF$_2$)$_q$ (wherein 1≤q≤10), —CR$_2$— (wherein each R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula 3:

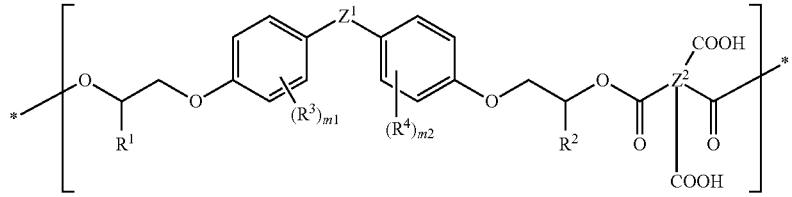

Chemical Formula 3 wherein in Chemical Formula 3,
each of R$^1$ and R$^2$ is independently hydrogen or a substituted or unsubstituted (meth)acryloyloxyalkyl group (wherein "alkyl" is a C1 to C20 alkyl group),
each of R$^3$ and R$^4$ is independently hydrogen, a halogen, or a substituted or unsubstituted C1 to C20 alkyl group,
Z$^1$ is a moiety selected from linking moieties represented by Chemical Formulae 1-1 to 1-6,
Z$^2$ is an aromatic organic group such as the moieties set forth above, and
m1 and m2 are independently an integer ranging from 0 to 4.

The multiple aromatic ring-containing polymer may include a functional group represented by Chemical Formula 4 at one or both terminal ends:

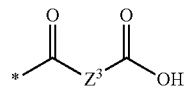

Chemical Formula 4 wherein in Chemical Formula 4,
Z$^3$ is a moiety represented by one of Chemical Formulae 4-1 to 4-7:

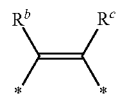

Chemical Formula 4-1 wherein in Chemical Formula 4-1,
each of R$^b$ and R$^c$ is independently hydrogen, a substituted or unsubstituted C1 to C20 alkyl group, a C2 to C20 ester group, or a C2 to C20 ether group.

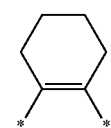

Chemical Formula 4-2

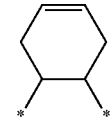

Chemical Formula 4-3

-continued

Chemical Formula 4-4

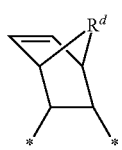

Chemical Formula 4-5 wherein in Chemical Formula 4-5,
R$^d$ is O, S, NH, a substituted or unsubstituted C1 to C20 alkylene group, a C1 to C20 alkylamine group, or a C2 to C20 alkenylamine group.

Chemical Formula 4-6

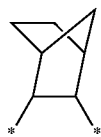

Chemical Formula 4-7

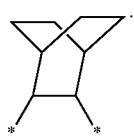

The COOH containing polymer binder including the aforementioned skeleton structure may be prepared by any known method or may be commercially available. In some embodiments, the multiple aromatic ring-containing polymer may be an acid adduct of bisphenol fluorene epoxy acrylate.

As non-limiting examples, the multiple aromatic ring-containing polymer may include a reaction product of a fluorene compound selected from 9,9-bis(4-hydroxyphenyl) fluorene, 9,9-bis(4-aminophenyl)fluorene, 9,9-bis[4-(glycidyloxy)phenyl]fluorene, and 9,9-bis[4-(2-hydroxyethoxy)phenyl]fluorene with an appropriate compound capable of reacting with the fluorene compound (e.g., an aromatic dianhydride selected from 9,9-bis-(3,4-dicarboxyphenyl) fluorene dianhydride, pyromellitic dianhydride (PDMA), biphenyltetracarboxylic dianhydride (BPDA), benzophenoltetracarboxylic dianhydride, and naphthalenetetracarboxylic dianhydride, a C2 to C30 diol compound, epichlorohydrine, or the like). The fluorene compound, dianhydrides, a diol compound, and the like are commercially available, and the reaction conditions therebetween may be selected appropriately.

In the embodiments, the bisphenol fluorene epoxy acrylate may be prepared by reacting 4,4-(9-fluorenylidene)-diphenol and epichlorohydrine to obtain an epoxy compound having a fluorene moiety, and the epoxy compound is reacted with an acrylic acid to obtain a fluorenyl epoxy acrylate, which is then further reacted with biphenyl dianhydride and/or phthalic anhydride. The aforementioned reaction scheme may be summarized as below:

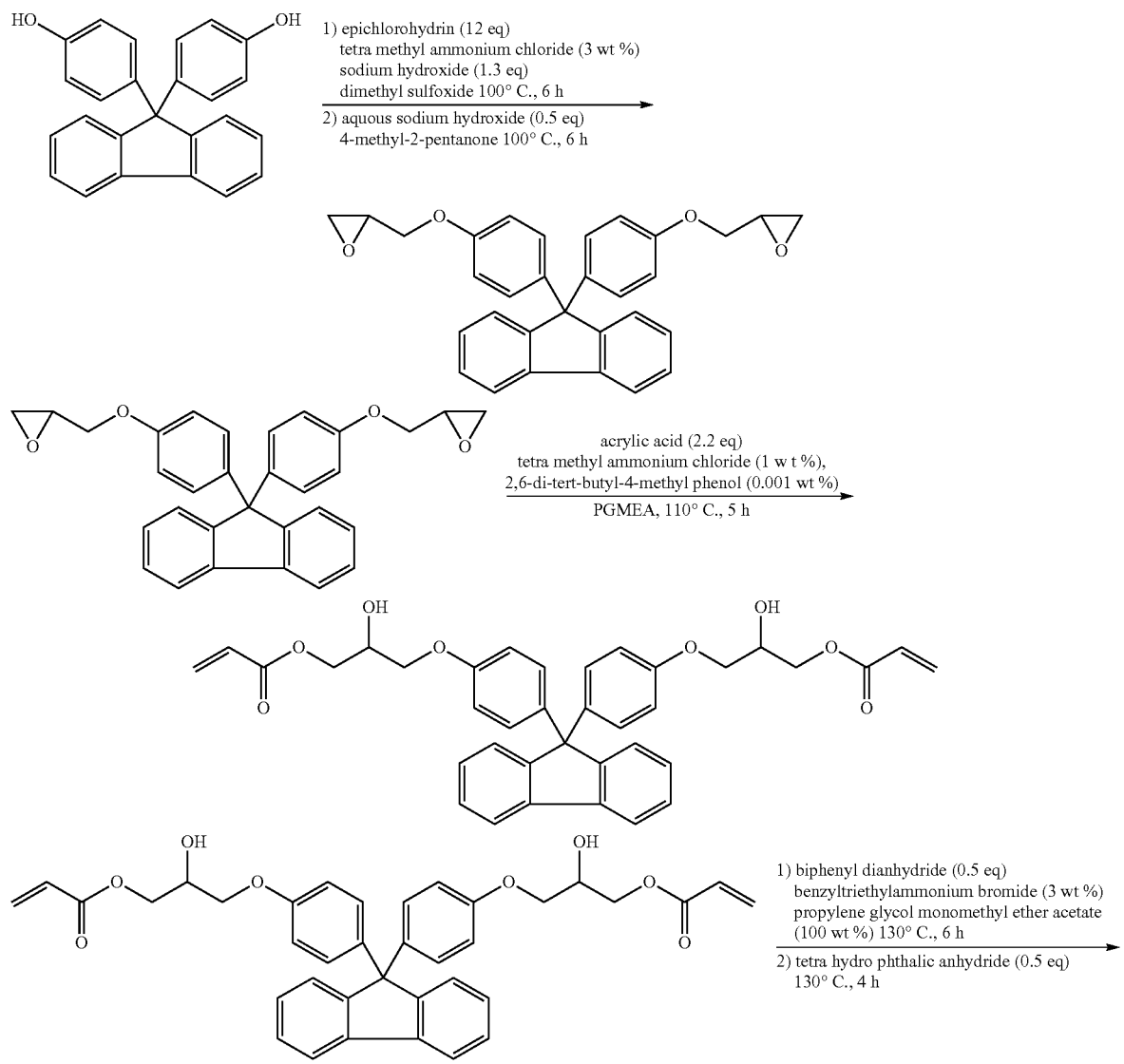

-continued

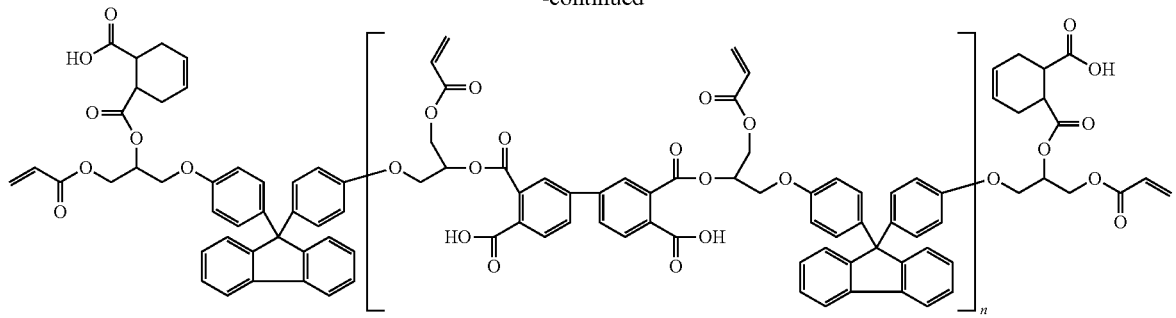

The fluorene compound and the compounds capable of reacting with the fluorene compound (e.g., the acid anhydride) are commercially available and the conditions for the reaction therebetween may be selected appropriately.

The carboxylic acid group-containing binder may have an acid value of greater than or equal to about 50 milligrams of potassium hydroxide (KOH) per one gram of the polymer (mg KOH/g) in order to disperse quantum dots well, but the acid value may vary depending on a skeleton structure of the multiple aromatic ring-containing polymer (e.g., a chemical structure of a main chain or a side chain of the binder). For example, the carboxylic acid group-containing binder may have an acid value of greater than or equal to about 55 mg KOH/g, greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, or greater than or equal to about 110 mg KOH/g. The carboxylic acid group-containing binder may have an acid value of, for example, less than or equal to about 200 mg KOH/g, for example, less than or equal to about 190 mg KOH/g, less than or equal to about 180 mg KOH/g, or less than or equal to about 170 mg KOH/g, but it is not limited thereto. The quantum dots are mixed with a solution of a binder having the acid value within the aforementioned range to provide a quantum dot-binder dispersion; the obtained quantum dot-binder dispersion may have the improved compatibility with the other components for the photoresist (e.g., a photopolymerizable monomer, a photoinitiator, a solvent, etc.) and thereby the quantum dots may be dispersed in the final composition (i.e., photoresist composition) to form a pattern. In an embodiment, the carboxylic acid group-containing binder may have an acid value of about 50 mg KOH/g to about 150 mg KOH/g. The aforementioned range may provide effects of increasing the stability and compatibility of the dispersion.

In some embodiments, the carboxylic acid group-containing binder may further include an acrylic copolymer of a monomer mixture including the first monomer having a carboxylic acid group and a carbon-carbon double bond and the second monomer having a carbon-carbon double bond and a hydrophobic moiety but including no carboxylic acid group. The monomer mixture may further include a third monomer having a carbon-carbon double bond and a hydrophilic moiety but including no carboxylic acid group.

Therefore, the acrylic copolymer may include a first repeating unit derived from the first monomer and the second repeating unit derived from the second monomer.

The first repeating unit may include a repeating unit represented by Chemical Formula A-1, a repeating unit represented by Chemical Formula A-2, or a combination thereof:

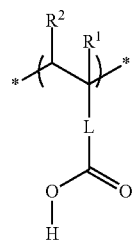

Chemical Formula A-1 wherein in Chemical Formula A-1,
$R^1$ is hydrogen, a C1 to C3 alkyl group, or —$(CH_2)_n$—COOH (wherein n is 0 to 2),
$R^2$ is hydrogen, a C1 to C3 alkyl group, or —COOH, and
L is a single bond, a C1 to C15 aliphatic hydrocarbon group such as a C1 to C3 alkylene group, a C6 to C30 aromatic hydrocarbon group such as a C6 to C12 arylene group, a C6 to C30 alicyclic hydrocarbon group (e.g., a cycloalkylene group or a cycloalkenylene group such as cyclohexylene, norbonylene, or norbornene or the like), or a C1 to C15 aliphatic hydrocarbon group substituted with a C6 to C30 aromatic hydrocarbon group or a C6 to C30 alicyclic hydrocarbon group,

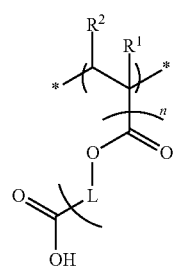

Chemical Formula A-2 wherein in Chemical Formula A-2,
$R^1$ is hydrogen, a C1 to C3 alkyl group, or —$(CH_2)_n$—COOH (wherein n is 0 to 2),
$R^2$ is hydrogen or a C1 to C3 alkyl group,
L is a C1 to C15 alkylene group, a C1 to C15 alkylene group wherein at least one methylene group is substituted with —CO—, —O—, or —COO—, a C6 to C30 aromatic hydrocarbon group such as a C6 to C30 arylene group, a C6 to C30 alicyclic hydrocarbon group (e.g., a cycloalkylene group or a cycloalkenylene group such as cycloalkylene, norbonylene, norbornene), or a C1 to C15 aliphatic hydrocarbon group substituted with a C6 to C30 aromatic hydrocarbon group or a C6 to C30 alicyclic hydrocarbon group, and n is an integer of 1 to 3.

The second repeating unit may include a repeating unit represented by Chemical Formula B, a repeating unit represented by Chemical Formula C, a repeating unit represented by Chemical Formula D, a repeating unit represented by Chemical Formula E, or a combination thereof:

Chemical Formula B

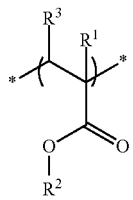

wherein in Chemical Formula B, $R^1$ is hydrogen or a C1 to C3 alkyl group, $R^2$ is a C1 to C15 aliphatic hydrocarbon group (e.g., a C1 to C15 alkyl group such as methyl, ethyl, propyl, and the like), a C6 to C30 aromatic hydrocarbon group (a C6 to C24 aryl group such as a phenyl group, a naphthyl group or the like), a C6 to C30 alicyclic hydrocarbon group such as a cycloalkyl group (e.g., a cyclohexyl group, a norbornyl group), a cycloalkenyl group (e.g., norbornene, or the like), or a C1 to C15 aliphatic hydrocarbon group substituted with a C6 to C30 aromatic hydrocarbon group or a C6 to C30 alicyclic hydrocarbon group (e.g., an arylalkyl group), and $R^3$ is hydrogen or a C1 to C3 alkyl group;

Chemical Formula C

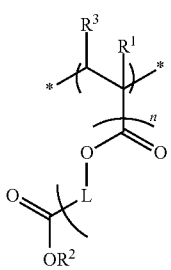

wherein in Chemical Formula 3, $R^1$ is hydrogen or a C1 to C3 alkyl group,

L is a C1 to C15 alkylene group, a C1 to C15 alkylene group wherein at least one methylene group is substituted with —CO—, —O—, or —COO—, a C6 to C30 aromatic hydrocarbon group such as a C6 to C30 arylene group, a C6 to C30 alicyclic hydrocarbon group (e.g., a cycloalkylene group or cycloalkenylene group such as a norbornene moiety), or a C1 to C15 aliphatic hydrocarbon group substituted with a C6 to C30 aromatic hydrocarbon group or a C6 to C30 alicyclic hydrocarbon group, $R^2$ is a C1 to C15 aliphatic hydrocarbon group (e.g., a C1 to C15 alkyl group such as methyl, ethyl, propyl, and the like), a C6 to C30 aromatic hydrocarbon group (e.g., a C6 to C24 aryl group such as a phenyl group, a naphthyl group, or the like), a C6 to C30 alicyclic hydrocarbon group such as a cycloalkyl group (e.g., a cyclohexyl group, a norbornyl group, or the like), or a C1 to C15 aliphatic hydrocarbon group substituted with a C6 to C30 aromatic hydrocarbon group or a C6 to C30 alicyclic hydrocarbon group (e.g., an arylalkyl group), $R^3$ is hydrogen or a C1 to C3 alkyl group, and n is an integer of 1 to 3;

Chemical Formula D

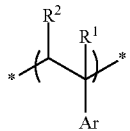

wherein in Chemical Formula D, each of $R^1$ and $R^2$ is independently hydrogen or a C1 to C3 alkyl group, Ar is a substituted or unsubstituted C6 to C30 aromatic hydrocarbon group (e.g., an aryl group such as phenyl and an arylalkyl group such as benzyl and the like), or a substituted or unsubstituted C6 to C30 alicyclic hydrocarbon group (e.g., a cycloalkyl group or a cycloalkenyl group);

Chemical Formula E

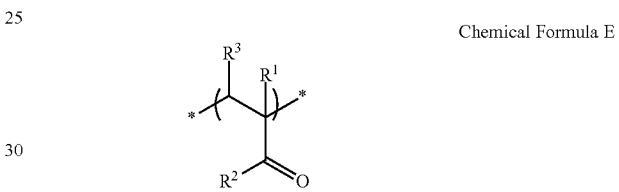

wherein in Chemical Formula E, $R^1$ is hydrogen or a C1 to C3 alkyl group, $R^2$ is a C1 to C15 aliphatic hydrocarbon group, a C6 to C30 aromatic hydrocarbon group, a C6 to C30 alicyclic hydrocarbon group (for example, a cycloalkyl group such as cyclohexyl, or a cycloalkenyl group such as norbornene), or a C1 to C15 aliphatic hydrocarbon group substituted with a C6 to C30 aromatic hydrocarbon group or a C6 to C30 alicyclic hydrocarbon group, and $R^3$ is hydrogen or a C1 to C3 alkyl group.

The acrylic copolymer may further include a third repeating unit derived from a third monomer, and the third repeating unit may be represented by Chemical Formula F:

Chemical Formula F

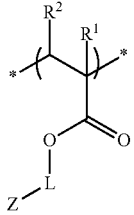

wherein in Chemical Formula F, each of $R^1$ and $R^2$ is independently hydrogen or a C1 to C3 alkyl group, L is a C1 to C15 alkylene group, a C1 to C15 alkylene group wherein at least one methylene group is substituted with —CO—, —O—, or —COO—, a C6 to C30 aromatic hydrocarbon group such as a C6 to C30 arylene group, a C6 to C30 alicyclic hydrocarbon group (e.g., a cycloalkylene group or a cycloalkenylene group such as a norbornene moiety), or a C1 to C15 aliphatic hydrocarbon group substituted with a C6 to C30 aromatic hydrocarbon group or a C6 to C30 alicyclic hydrocarbon group, and Z is a hydroxyl group (—OH), a mercapto group (—SH), or an amino group (—NHR, wherein R is hydrogen or a C1 to C5 alkyl group).

In the acrylic copolymer, an amount of the first repeating unit derived from the first monomer may be greater than or equal to about 10 mole percent (mol %), for example, greater than or equal to about 15 mol %, greater than or equal to about 25 mol %, or greater than or equal to about 35 mol %. In the carboxylic acid group-containing binder, an amount of the first repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %.

In the acrylic copolymer, an amount of the second repeating unit derived from the second monomer may be greater than or equal to about 10 mol %, for example, greater than or equal to about 15 mol %, greater than or equal to about 25 mol %, or greater than or equal to about 35 mol %. In the carboxylic acid group-containing binder, an amount of the second repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 40 mol %, less than or equal to about 35 mol %, or less than or equal to about 25 mol %.

In the acrylic copolymer, an amount of the third repeating unit derived from the third monomer may be greater than or equal to about 1 mol %, for example, greater than or equal to about 5 mol %, greater than or equal to about 10 mol %, or greater than or equal to about 15 mol %. In the carboxylic acid group-containing binder, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the carboxylic acid group-containing binder may be a copolymer of (meth)acrylic acid and at least one of the second/third monomer may be selected from arylalkyl (meth)acrylate, hydroxyalkyl (meth)acrylate, and styrene. The carboxylic acid group-containing binder may include a copolymer of a (meth)acrylic acid, and at least one monomer selected from an arylalkyl (meth)acrylate, a hydroxyalkyl (meth)acrylate, and styrene. For example, the carboxylic acid group-containing binder may be a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxyethyl methacrylate copolymer.

A weight average molecular weight of the multiple aromatic ring-containing polymer or the acrylic copolymer be greater than or equal to about 1,000 grams per mole (g/mol), for example, greater than or equal to about 2,000 g/mol, greater than or equal to about 3,000 g/mol, or greater than or equal to about 5,000 g/mol. The carboxylic acid group-containing binder may have a weight average molecular weight of less than or equal to about 50,000 g/mol, for example, 10,000 g/mol or 9,000 g/mol or less. While not wishing to be bound by theory, it is understood that within the foregoing ranges, more improved developability may be ensured.

In the photosensitive composition, an amount of the carboxylic acid group-containing binder may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on the total weight of the composition. An amount of the carboxylic acid group-containing binder may be less than or equal to about 35 wt %, for example, less than or equal to about 30 wt %, less than or equal to about 25 wt %, or less than or equal to about 20 wt %, based on the total weight of the composition. In an embodiment, an amount of the carboxylic acid group-containing binder may be 2.5 to 30 wt %, based on the total weight of solids (i.e., non-volatiles) of the composition. Within the aforementioned range, appropriate developability and improved processability may be accomplished in a subsequent pattern forming process while ensuring dispersibility of the quantum dots.

The photosensitive composition according to an embodiment includes a photopolymerizable monomer having a carbon-carbon double bond. Types of the photopolymerizable monomer are not particularly limited as long as they include a carbon-carbon double bond and may be polymerized by light. For example, the photopolymerizable monomer may be a monomer or an oligomer that may be used in a photosensitive composition. The photopolymerizable monomer may include a monofunctional or multi-functional ester of (meth)acrylic acid having at least one ethylenic unsaturated double bond. For example, the photopolymerizable monomer may include a vinyl monomer, an unsaturated ethylenic oligomer, a homopolymer thereof, a copolymer of the unsaturated ethylenic oligomer and an ethylenic unsaturated monomer, or a combination thereof. Examples of the photopolymerizable monomer may include, but are not limited to, alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, bisphenol A epoxyacrylate, bisphenol A di(meth)acrylate, trimethylolpropane tri(meth)acrylate, ethylene glycol monomethyl ether (meth)acrylate, novolacepoxy (meth)acrylate, diethylene glycol di(meth)acrylate, triethylene glycol di(meth)acrylate, propylene glycol di(meth)acrylate, tris(meth)acryloyloxyethyl phosphate, and the like. The photopolymerizable monomer of the embodiments may include a di(meth)acrylate compound, a tri(meth)acrylate compound, a tetra(meth)acrylate compound, a penta(meth)acrylate compound, a hexa(meth)acrylate compound, or a combination thereof.

In the photosensitive composition, the amount of the photopolymerizable monomer may be greater than or equal to about 0.5 wt %, for example, greater than or equal to about 1 wt %, greater than or equal to about 2 wt %, or greater than or equal to about 5 wt % with respect to a total amount of the composition.

The amount of the photopolymerizable monomer may be less than or equal to about 24 wt %, for example less than or equal to about 20 wt %, less than or equal to about 10 wt %, with respect to a total amount of the composition. In some embodiments, the amount of the photopolymerizable monomer may be between 10 wt % and 20 wt %, based on a total weight of the solid content (i.e., the non-volatiles). While not wishing to be bound by theory, it is understood that within the aforementioned range, the photosensitive composition may show improved patternability.

The photosensitive composition may include a photopolymerization initiator. Types of the photopolymerizable initiator are not particularly limited, and may be selected appropriately. For example, the available photopolymerization initiator may include a triazine compound, an acetophenone compound, a benzophenone compound, a thioxanthone compound, a benzoin compound, an oxime compound, or a combination thereof, but it is not limited thereto.

Examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphthol-1-yl)-4,6-bis(trichloromethyl)-s-triazine, 2-(4-methoxynaphthol-1-yl)-4,6-bis(trichloromethyl)-s-triazine, 2,4-trichloromethyl (piperonyl)-6-triazine, and 2,4-(trichloromethyl (4'-methoxystyryl)-6-triazine, but are not limited thereto.

Examples of the acetophenone compound may be 2,2'-diethoxy acetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, but are not limited thereto.

Examples of the benzophenone compound may be benzophenone, benzoyl benzoate, benzoyl methyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound may be thioxanthone, 2-methylthioxanthone, iso-propylthioxanthone, 2,4-diethylthioxanthone, 2,4-di-iso-propylthioxanthone, 2-chlorothioxanthone, and the like, but are not limited thereto.

Examples of the benzoin compound may include benzoin, benzoin methyl ether, benzoin ethyl ether, benzoin iso-propyl ether, benzoin iso-butyl ether, benzyl dimethyl ketal, and the like, but are not limited thereto.

Examples of the oxime compound may be 2-(o-benzoyloxime)-1-[4-(phenylthio)phenyl]-1,2-octanedione, 1-(o-acetyloxime)-1-[9-ethyl-6-(2-methylbenzoyl)-9H-carbazol-3-yl]ethanone, and the like, but are not limited thereto.

The photopolymerization initiator may also be a carbazole compound, a diketone compound, a sulfonium borate compound, a diazo compound, a bis-imidazole compound, and the like, in addition to the photopolymerization initiators.

In the photosensitive composition, an amount of the photoinitiator may be greater than or equal to about 0.01 wt %, for example, greater than or equal to about 0.1 wt %, or greater than or equal to about 1 wt % or greater than or equal to about 2 wt %, based on the total weight of the composition. The amount of the photoinitiator may be less than or equal to about 10 wt %, for example, less than or equal to about 5 wt %, less than or equal to about 4 wt %, based on the total weight of the composition. In an embodiment, the amount of the photoinitiator may be about 0.1 to about 1 wt %, based on the total weight of solids (i.e., non-volatiles) of the composition. While not wishing to be bound by theory, it is understood that within the aforementioned ranges, the photosensitive composition may have a large exposure margin.

The photoresist composition may further include a thiol compound represented by Chemical Formula 5:

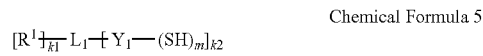

Chemical Formula 5 wherein in Chemical Formula 5, $R^1$ is selected from hydrogen, a substituted or unsubstituted C1 to C30 linear or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are each independently hydrogen or a C1 to C30 linear or branched alkyl group), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted alkylene group and X is a halogen), —C(=O)OR' (wherein R' is hydrogen or a C1 to C20 linear or branched alkyl group), —CN, or —C(=O)ONRR' (wherein R and R' are each independently hydrogen or a C1 to C20 linear or branched alkyl group), $L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—$CH_2$—) groups of the substituted or unsubstituted C1 to C30 alkylene group may be replaced by a sulfonyl group (—$SO_2$—), a carbonyl group (CO), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, a C1 to C30 alkylene group or a C2 to C30 alkenylene group wherein at least one methylene (—$CH_2$—) group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond and provided that the sum of k1 and k2 does not exceed the valence of $L_1$.

The thiol compound may include a compound of Chemical Formula 5-1:

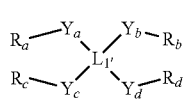

Chemical Formula 5-1 wherein in Chemical Formula 5-1, $L_1'$ is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, each of $Y_a$ to $Y_d$ is independently a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene group (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof, and each of $R_a$ to $R_d$ is the same as $R^1$ of Chemical Formula 5 or —SH, provided that at least two of $R_a$ to $R_d$ are —SH.

The reactive compound may be ethoxylated pentaerythritol tetra(3-mercaptopropionate), trimethylolpropane tri(3-mercaptopropionate), trimethylol propane-tri(3-mercaptoacetate), glycol di-3-mercaptopropionate, polypropylene glycol 3-mercaptopropionate, ethoxylated trimethylpropane tri(3-mercaptopropionate), glycol dimercaptoacetate, ethoxylated glycol dimercaptoacetate, 1,4-bis(3-mercaptobutyryloxy)butane, trimethylolpropane tris(3-mercaptopropionate), tris[2-(3-mercaptopropinonyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol including 1 to 10 ethylene glycol repeating units, or a combination thereof.

Addition of the thiol compound may provide stability of the quantum dots and increased light efficiency during the process. The amount of the thiol compound may be greater than or equal to about 0.5 wt % and less than or equal to about 30 wt % (e.g., less than or equal to about 25 wt %, less than or equal to about 20 wt %, less than or equal to about 15 wt %, less than or equal to about 10 wt %, or less than or equal to about 5 wt %).

If desired, the photosensitive composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on the photosensitive composition and the pattern obtained therefrom.

The light diffusing agent may increase a refractive index of the composition in order to increase a chance of the incident light to meet with quantum dots. The light diffusing agent may include inorganic oxide particles such as alumina, silica, zirconia, titanium oxide particulates, or zinc oxide, and metal particles such as gold, silver, copper, or platinum, but is not limited thereto.

The leveling agent is aimed to prevent stains or spots and to improve planarization and leveling characteristics of a film, and examples thereof may include the following but are not limited thereto.

A fluorine-containing leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

Types and amounts of the additives may be adjusted as necessary. The coupling agent is aimed to increase adherence with respect to the substrate and examples thereof may include a silane coupling agent. Examples of the silane coupling agent may be vinyl trimethoxysilane, vinyl tris(2-methoxyethoxysilane), 3-glycidoxypropyl trimethoxysilane, 2-(3,4-epoxycyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like.

The photosensitive composition includes a solvent. An amount of the solvent may be determined considering the amounts of the above main components (i.e., the organic ligand-containing quantum dots, the COOH group-containing binder, the photopolymerizable monomer mixture, and the photoinitiator), and additives. The composition may include the solvent in such an amount that the remaining amount of the composition other than the amounts of the solid (i.e., non-volatiles) components is the amount of the solvent. The solvent may be selected appropriately considering its affinity for other components (e.g., the binder, the photopolymerizable monomer, the photoinitiator, and other additives), its affinity for the alkali developing solution, and its boiling point. Examples of the solvent may be ethylene glycols such as ethyl 3-ethoxy propionate, ethylene glycol, diethylene glycol, or polyethylene glycol; glycol ethers such as ethylene glycol monomethyl ether, ethylene glycol monoethyl ether, diethylene glycol monomethyl ether, ethylene glycol diethyl ether, and diethylene glycol dimethyl ether; glycol ether acetates such as ethylene glycol acetate, ethylene glycol monoethyl ether acetate, diethylene glycol monoethyl ether acetate, and diethylene glycol monobutyl ether acetate; propylene glycols such as propylene glycol; propylene glycol ethers such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; propylene glycol ether acetates such as propylene glycol monomethyl ether acetate and dipropylene glycol monoethyl ether acetate; amides such as N-methylpyrrolidone, dimethyl formamide, and dimethyl acetamide; ketones such as methyl ethyl ketone (MEK), methyl iso-butyl ketone (MIBK), and cyclohexanone; petroleum products such as toluene, xylene, and solvent naphtha; esters such as ethyl acetate, butyl acetate, and ethyl lactate; ethers such as diethyl ether, dipropyl ether, and dibutyl ether; and combinations thereof.

A method of preparing a photosensitive composition according to an embodiment includes:

providing (for example, by preparing) a binder solution including the foregoing COOH containing binder and the solvent;

combining (for example, by dispersing) a plurality of quantum dots, wherein the quantum dot has an organic ligand with a hydrophobic moiety bound to a surface of the quantum dot, with the binder solution to obtain a quantum dot-binder dispersion; and combining (for example, by mixing) the quantum dot-binder dispersion with at least one selected from a photopolymerizable monomer, a photoinitiator, a thiol compound, and a solvent.

A mixing manner is not particularly limited, and may be appropriately selected. For example, each component may be mixed sequentially or simultaneously.

The method may further include selecting quantum dots including an organic ligand with a hydrophobic moiety bound to the surface of the quantum dots, and selecting a carboxylic acid group-containing binder capable of dispersing the quantum dots. In the step of selecting the binder, the carboxylic acid group-containing binder are the same as set forth above and the chemical structure and the acidity of the copolymer may be considered.

Details of the quantum dots, the carboxylic acid group-containing binder, the photopolymerizable monomer, the thiol compound, and the photoinitiator are the same as set forth above.

The photosensitive composition may be developed with an alkaline aqueous solution, and thus a quantum dot-polymer composite pattern may be patterned from the photosensitive composition without using an organic solvent developing solution.

A non-limiting method of forming a pattern is explained with reference to FIG. 1.

First, the photosensitive composition is coated on a predetermined substrate (e.g., a glass substrate or a glass substrate coated with a predetermined thickness of $SiN_x$ (protective layer) (e.g., 500 to 1,500 Angstroms (Å) of the protective layer)) in an appropriate manner such as spin coating, slit coating, and the like to form a film of a predetermined thickness (e.g., a thickness of 3 to 30 micrometers, μm). The formed film may be pre-baked, if desired. The specific conditions of pre-baking such as temperature, time, and atmosphere may be appropriately selected.

The formed (or optionally, pre-baked) film is exposed to light of a predetermined wavelength under a mask having a predetermined pattern. The wavelength and the intensity of light may be selected depending on the types and the amounts of the photoinitiator, the types and the amounts of quantum dots, or the like.

The exposed film is treated with an alkali developing solution, and thereby the unexposed region in the film is dissolved to form a desired pattern. The pattern may be post-baked, if desired, to improve crack resistance and solvent resistance of the pattern, for example, at a temperature of about 150° C. to about 230° C. for a predetermined time (e.g., greater than or equal to about 10 minutes (min) or greater than or equal to about 20 min).

If a quantum dot-polymer composite obtained from the photosensitive composition of the embodiments is to be used as a color filter, two or three types of photosensitive compositions each including red quantum dots, green quantum dots, (or optionally, blue quantum dots) are prepared, and the patterning process is repeated for each composition to provide a quantum dot-polymer composite having a desired pattern.

When the quantum dot-polymer composite obtained from the photosensitive composition is used as a color filter, two types of photosensitive compositions including red quantum dots and green quantum dots, respectively, are prepared, and the patterning process is repeated for each composition to provide a quantum dot-polymer composite having a desirable pattern.

Accordingly, another embodiment provides a quantum dot-polymer composite pattern. The quantum dot-polymer composite pattern may include:

a plurality of quantum dots including an organic ligand with a hydrophobic moiety on (e.g., bound to) a surface of the quantum dots; a carboxylic acid group (—COOH)-containing binder; and a polymerization product of a photopolymerizable monomer having a carbon-carbon double bond. The carboxylic acid group-containing binder includes a multiple aromatic ring-containing polymer including a carboxylic acid group and a main chain having a backbone structure incorporated in the main chain, wherein the backbone structure includes a quaternary carbon atom, which is a part of a cyclic group, and two aromatic rings are bound to the quaternary carbon atom that is a constituent atom of another cyclic moiety. The carboxylic acid group may be attached to the main chain. The plurality of quantum dots are dispersed (e.g., separated from each other) by the carboxylic acid group-containing binder and the polymerization product without substantial agglomeration.

Details of the quantum dots, the binder, the photopolymerizable monomer, and the like are the same as set forth above.

Hereinafter, the embodiments are illustrated in more detail with reference to examples. However, they are exemplary embodiments of the present disclosure, and the present disclosure is not limited thereto.

EXAMPLES

Example 1

[1] Preparation of Quantum Dot-Binder Dispersion

A chloroform dispersion of red light emitting quantum dots including oleic acid as an organic ligand with a hydrophobic moiety on a surface thereof is prepared.

28 grams (g) of the chloroform dispersion is mixed with 100 g of a binder (bisphenol fluorene epoxy acrylate acid adduct, purchased from Nippon Steel Chemical Co., Ltd., acid value: 50 milligrams of potassium hydroxide per one gram of the binder (mg KOH/g), weight average molecular weight: 5000) solution (of polypropylene glycol monomethyl ether acetate having a concentration of 30 percent by weight, wt %) to provide a quantum dot-binder dispersion.

Figure 2:
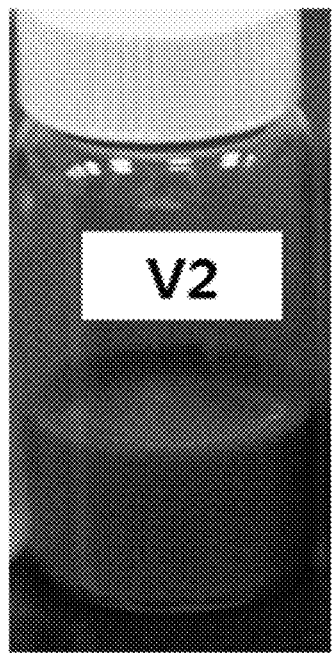
FIG. 2 is a photographic image showing a quantum dot-binder dispersion prepared in Example 1.

A photographic image of the dispersion thus prepared is shown in FIG. 2. FIG. 2 confirms that quantum dots are uniformly dispersed in the quantum dot-binder dispersion.

[2] Preparation of the Photosensitive Composition

To the quantum dot-binder dispersion, 10 g of glycol di-3-mercaptopropionate, 100 g of hexaacrylate having the following structure (as a photopolymerizable monomer), 1 g of oxime and ketone initiators, and 300 g of PGMEA (as a solvent) are added to obtain a photosensitive composition.

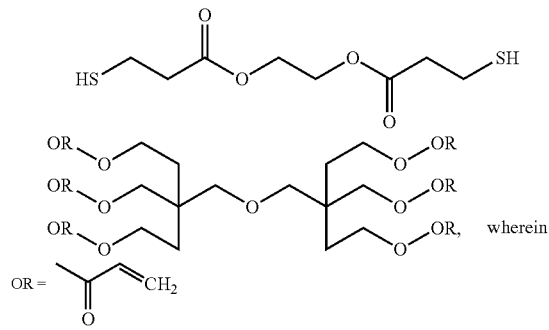

It is confirmed that the photosensitive composition thus prepared may form a dispersion without showing any noticeable agglomeration due to the addition of the quantum dots. Observation of the photosensitive composition thus prepared confirms that the aforementioned binder solution cannot disperse the quantum dots.

[3] Formation of Quantum Dot—Polymer Composite Pattern

The photosensitive composition obtained from item [2] is spin-coated on a glass substrate at 150 revolutions per minute (rpm) for 5 seconds (s) to provide a film. The obtained film is pre-baked at 100° C. for 2 min. The pre-baked film is irradiated with light (wavelength: 365 nanometers (nm), intensity: 30 milliwatts, mW) for 2 s under a mask having a predetermined pattern and developed by a potassium hydroxide-diluted aqueous solution (concentration: 0.043%) for 60 s to provide a pattern.

Figure 3:
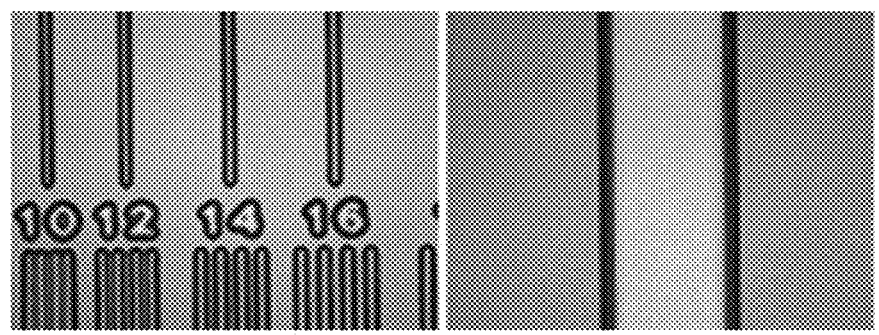
FIG. 3 is an optical microscopic image of the quantum dot-polymer composite pattern prepared in Example 1.

An optical microscope image of the obtained pattern is shown in FIG. 3.

Figure 4:
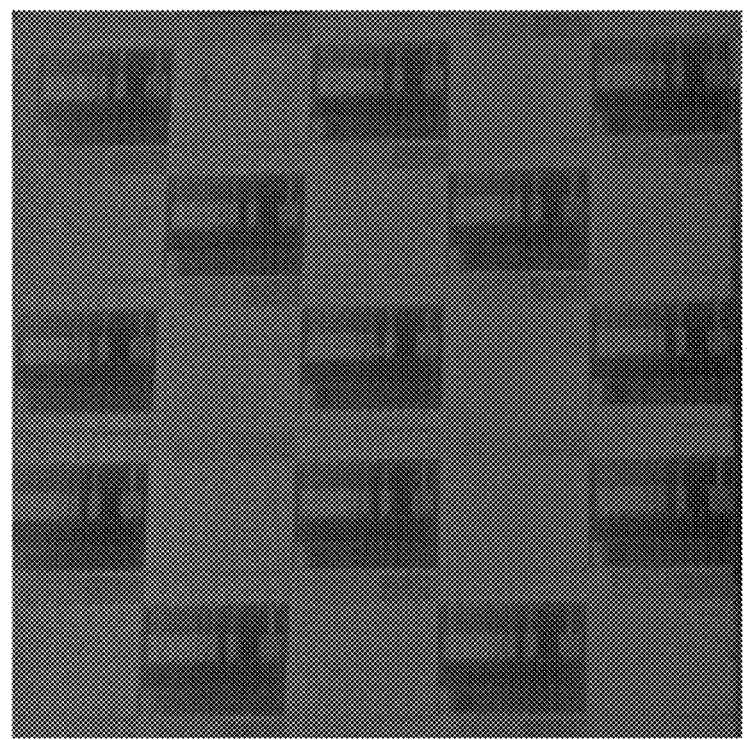
FIG. 4 is a photographic image showing that the pattern prepared in Example 1 emits red light when it is irradiated with blue light.

The results of FIG. 3 confirm that the composition of Example 1 may form a pattern (line width: 100 micrometers, um) including quantum dots dispersed in a polymer. When the obtained pattern is irradiated with blue light (wavelength: 450 nm), red light is emitted from the pattern (see FIG. 4).

Figure 5:
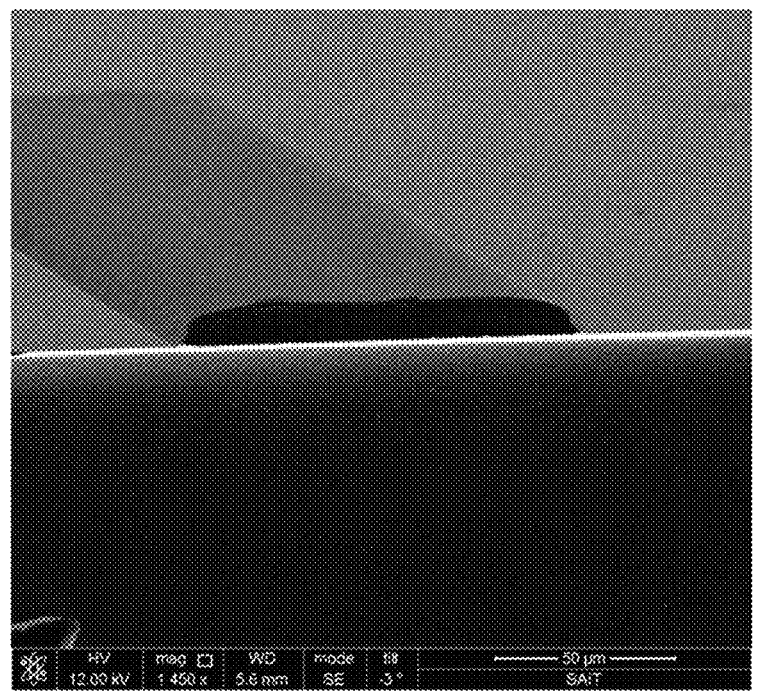
FIG. 5 is an optical microscopic image showing a cross-section of the pattern prepared in Example 1.

An optical microscope image showing the cross-section of the obtained pattern is shown in FIG. 5, which confirms that the cross-section does not have undercut.

Figure 6:
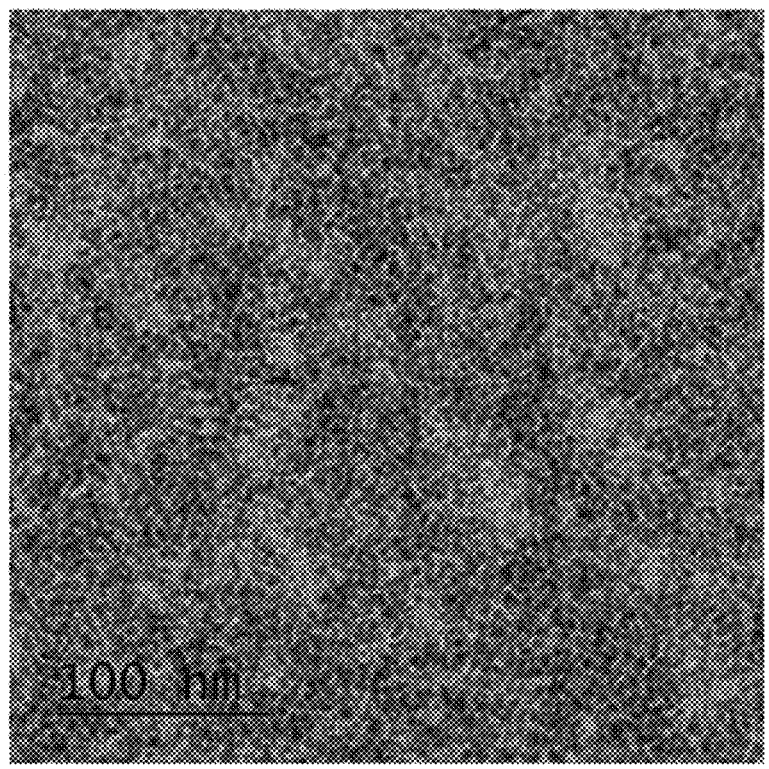
FIG. 6 is an electron-microscopic image showing quantum dots dispersed in the pattern prepared in Example 1.

A transmission electron microscopic image of the obtained pattern is shown in FIG. 6, which confirms that the quantum dots are well dispersed in the pattern.

Comparative Example 1

The same binder solution as used in Example 1, the same photopolymerizable acrylate monomer as used in Example 1, 1 g of the same oxime and ketone initiators as used in Example 1, 10 g of glycol di-3-mercaptopropionate, and 300 g of PGMEA are mixed to obtain a mixture.

The same chloroform dispersion of quantum dots as used in Example 1 is added to the obtained mixture to prepare a photosensitive composition.

Figure 7:
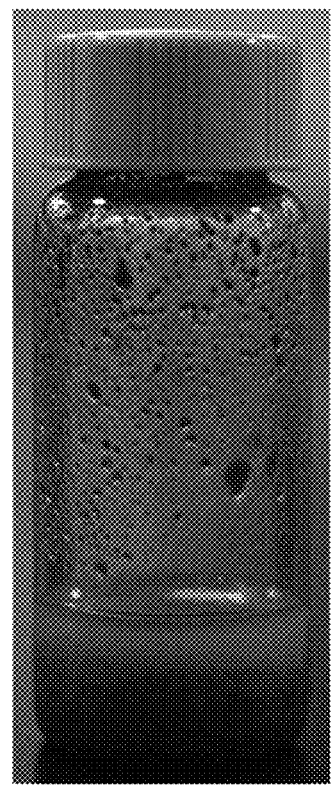
FIG. 7 is a photographic image showing a mixed solution of the quantum dot and the composition prepared in Comparative Example 1.
Figure 8:
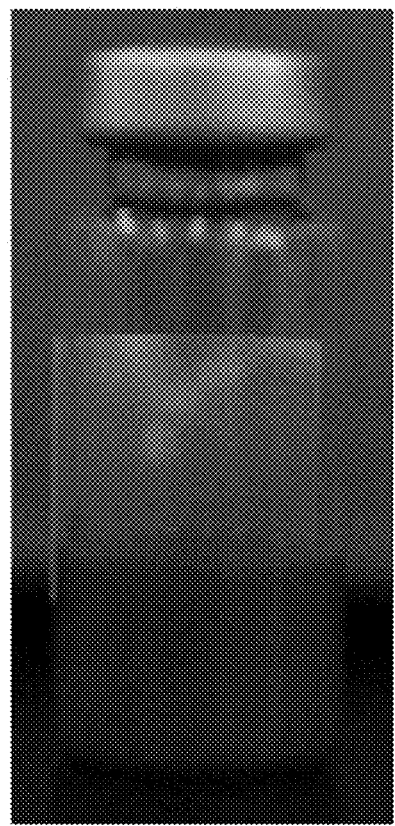
FIG. 8 is a photographic image showing a quantum dot-binder dispersion prepared in Example 1.

A photographic image of the photosensitive composition thus prepared is shown in FIG. 7. FIG. 7 confirms simple mixing of the same amounts of the binder, the photopolymerizable monomer, the initiator, and the solvent as used in Example 1 with the same quantum dot solution as used in Example 1 cannot provide a composition wherein the quantum dots are dispersed without substantial agglomeration.

Comparative Example 2

The photosensitive composition and the quantum dot polymer composite pattern are prepared in the same manner as in Example 1, except that the binder solution includes a four membered copolymer of methacrylic acid, benzyl methacrylate, hydroxyethyl methacrylate, and styrene (acid value: 60 mg KOH/g, weight average molecular weight: 8,000, acrylic acid:benzyl methacrylate:hydroxyethyl methacrylate:styrene (molar ratio)=61.5%:12%:16.3%:10.2%) (polypropylene glycol monomethyl ether acetate having a concentration of 30 wt %) instead of the bisphenol fluorene epoxy acrylate acid adduct.

Observation of the photosensitive composition thus prepared confirms that the aforementioned binder solution cannot disperse the quantum dots.

Figure 9:
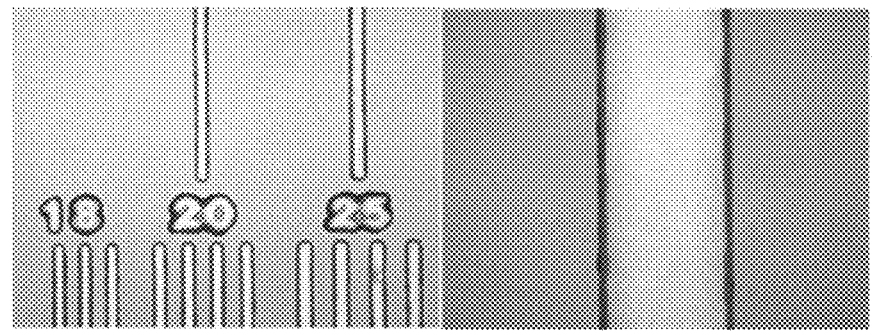
FIG. 9 is an optical microscopic image of the quantum dot-polymer composite pattern prepared in Comparative Example 2.

The microscopic image of the obtained pattern is shown in FIG. 9, which confirms that when the quantum dots are not uniformly dispersed, the photosensitive composition cannot provide a desired pattern of the quantum dot-polymer composite pattern.

Figure 10:
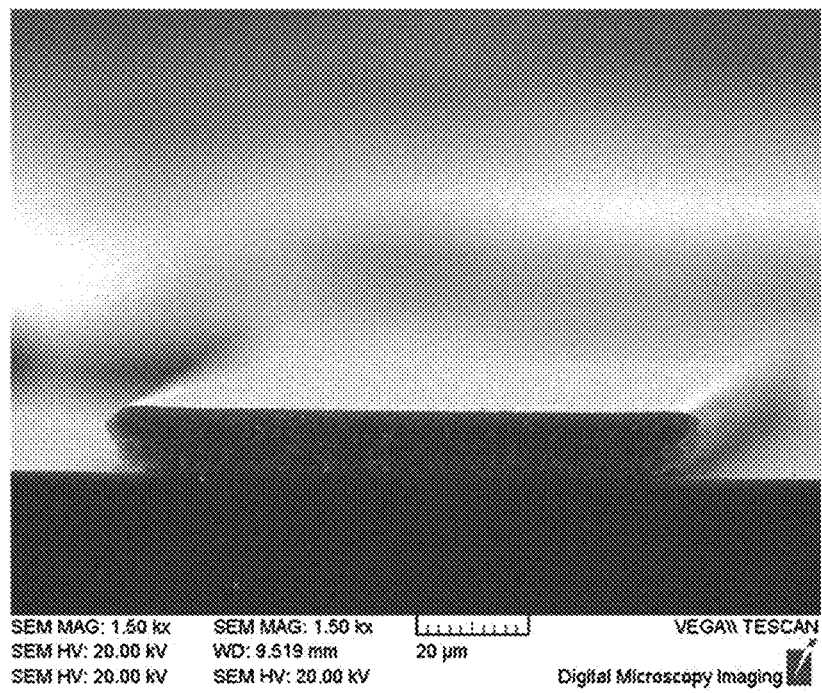
FIG. 10 is an optical microscopic image showing a cross-section of the pattern prepared in Comparative Example 2.

The microscopic image showing the cross-section of the obtained pattern is shown in FIG. 10, which confirms that the obtained pattern may suffer a serious undercut phenomenon.

While this disclosure has been described in connection with what is presently considered to be practical exemplary embodiments, it is to be understood that the instant disclosure is not limited to the presented embodiments, but, on the contrary, is intended to cover various modifications and equivalent arrangements included within the spirit and scope of the appended claims.

What is claimed is:

1. A photosensitive composition comprising:
a plurality of quantum dots, wherein the quantum dot comprises an organic ligand bound to a surface of the quantum dot, and wherein the organic ligand comprises RCOOH, RNH$_2$, R$_2$NH, R$_3$N, RSH, R$_3$P, ROH, RCOOR', RPO(OH)$_2$, R$_2$POOH (wherein R and R' are each independently a C5 to C24 aliphatic hydrocarbon group or a C6 to C20 aromatic hydrocarbon group), a polymeric organic ligand, or a combination thereof;
a binder;
a photopolymerizable monomer comprising a carbon-carbon double bond; and
a photoinitiator,
wherein the binder comprises a multiple aromatic ring-containing polymer comprising a carboxylic acid group and a main chain comprising a backbone structure incorporated in the main chain, wherein the backbone structure comprises a quaternary carbon atom, which is a part of a cyclic group, and two aromatic rings bound to the quaternary carbon atom, wherein the backbone structure of the multiple aromatic ring-containing polymer comprises a structural unit represented by Chemical Formula 1:

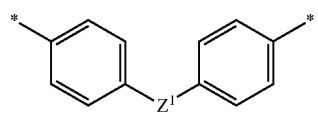

Chemical Formula 1 wherein in Chemical Formula 1,
* indicates a portion linked to an adjacent atom of the main chain of the binder,
$Z^1$ is a linking moiety represented by any one of Chemical Formulae 1-1 to 1-6, wherein in Chemical Formulae 1-1 to 1-6, and
* indicates a portion linked to an aromatic moiety:

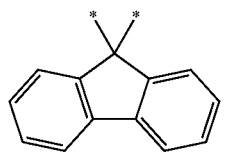

Chemical Formula 1-1

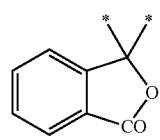

Chemical Formula 1-2

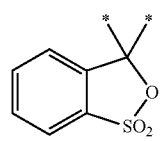

Chemical Formula 1-3

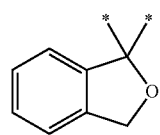

Chemical Formula 1-4

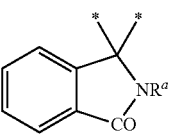

Chemical Formula 1-5 wherein in Chemical Formula 1-5,
$R^a$ is hydrogen, $-C_2H_5$, $-C_2H_4Cl$, $-C_2H_4OH$, $-CH_2CH=CH_2$, or a phenyl group,

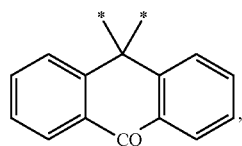

Chemical Formula 1-6 wherein the multiple aromatic ring-containing polymer has an acid value of greater than or equal to about 50 milligrams of KOH per gram of the polymer,
wherein the plurality of quantum dots are dispersed in the binder in the photosensitive composition, and are configured to have a quantum yield of greater than or equal to about 60% as measured with irradiation of an excitation light,
wherein the photosensitive composition is a colloidal dispersion having a dispersed phase with a dimension of less than or equal to about 1 micrometer, and
wherein an amount of the plurality of quantum dots including the organic ligand is greater than 5 weight percent based on a total amount of the composition.

2. The photosensitive composition of claim 1, wherein the organic ligand does not comprise a photopolymerizable functional group.

3. The photosensitive composition of claim 1, wherein the quantum dot comprises a Group II-VI compound, a Group III-V compound, a Group IV-VI compound, a Group IV compound, a Group I-III-VI compound, a Group I-II-IV-IV compound, or a combination thereof.

4. The photosensitive composition of claim 1, wherein the multiple aromatic ring-containing polymer has an acid value of less than or equal to about 200 milligrams of KOH per gram of the polymer.

5. The photosensitive composition of claim 1, wherein the multiple aromatic ring-containing polymer comprises a structural unit represented by Chemical Formula 2:

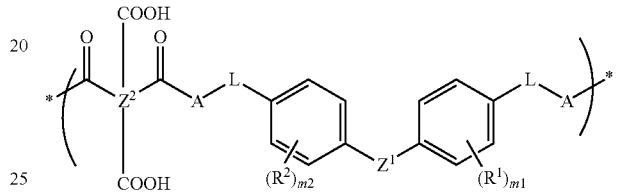

Chemical Formula 2 wherein in Chemical Formula 2,
each of $R^1$ and $R^2$ is independently hydrogen, a halogen, or a substituted or unsubstituted C1 to C20 alkyl group,
m1 and m2 are independently an integer ranging from 0 to 4,
$Z^1$ is a linking moiety represented by any one of Chemical Formulae 1-1 to 1-6,
L is a single bond, a C1 to C10 alkylene group, a C1 to C10 alkylene group comprising a substituent comprising a carbon-carbon double bond, a C1 to C10 oxy alkylene group, or a C1 to C10 oxy alkylene group comprising a substituent comprising a carbon-carbon double bond,
A is $-NH-$, $-O-$, or a C1 to C10 alkylene group, and
$Z^2$ is a C6 to C40 aromatic organic group.

6. The photosensitive composition of claim 5, wherein in Chemical Formula 2,
$Z^2$ is selected from a moiety represented by Chemical Formula 2-1, Chemical Formula 2-2, or Chemical Formula 2-3:

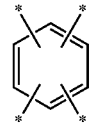

Chemical Formula 2-1 wherein in Chemical Formula 2-1, * indicates a portion linked to an adjacent carbonyl carbon atom,

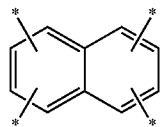

Chemical Formula 2-2 wherein in Chemical Formula 2-2,
* indicates a portion that is linked to an adjacent carbonyl carbon atom,

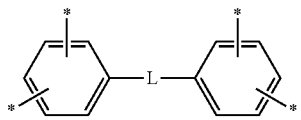

Chemical Formula 2-3 wherein in Chemical Formula 2-3,
* indicates a portion that is linked to an adjacent carbonyl carbon atom,
L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein each R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

7. The photosensitive composition of claim 1, wherein the multiple aromatic ring-containing polymer comprises a structural unit represented by Chemical Formula 3:

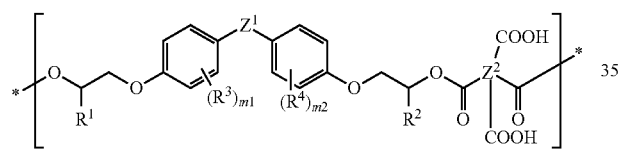

Chemical Formula 3 wherein in Chemical Formula 3,
each of R$^1$ and R$^2$ is independently hydrogen or a substituted or unsubstituted (meth)acryloyloxyalkyl group (wherein "alkyl" is a C1 to C20 alkyl group),
each of R$^3$ and R$^4$ is independently hydrogen, a halogen, or a substituted or unsubstituted C1 to C20 alkyl group,
Z$^1$ is independently a moiety selected from linking moieties represented by Chemical Formulae 1-1 to 1-6,
Z$^2$ is an aromatic organic as defined in Chemical Formula 2 and
m1 and m2 are independently an integer ranging from 0 to 4.

8. The photosensitive composition of claim 1, wherein the multiple aromatic ring-containing polymer comprises a functional group represented by Chemical Formula 4 at one or both terminal ends:

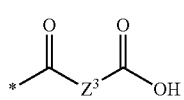

Chemical Formula 4 wherein in Chemical Formula 4,
Z$^3$ is a moiety represented by one of Chemical Formulae 4-1 to 4-7:

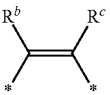

Chemical Formula 4-1 wherein in Chemical Formula 4-1,
each of R$^b$ and R$^c$ is independently hydrogen, a substituted or unsubstituted C1 to C20 alkyl group, a C2 to C20 ester group, or a C2 to C20 ether group,

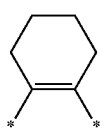

Chemical Formula 4-2

Chemical Formula 4-3

Chemical Formula 4-4

Chemical Formula 4-5 wherein in Chemical Formula 4-5,
R$^d$ is O, S, NH, a substituted or unsubstituted C1 to C20 alkylene group, a C1 to C20 alkylamine group, or a C2 to C20 alkenylamine group,

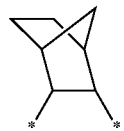

Chemical Formula 4-6

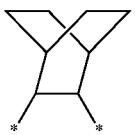

Chemical Formula 4-7

9. The photosensitive composition of claim 1, wherein a weight average molecular weight of the multiple aromatic ring-containing polymer is greater than or equal to about 1,000 grams per mole and less than or equal to about 50,000 grams per mole.

10. The photosensitive composition of claim 1, wherein photosensitive composition is developable by an alkali aqueous solution.

11. The photosensitive composition of claim 1, wherein the photosensitive composition further comprises a solvent, and
the photosensitive composition comprises, based on a total weight of the composition:
about 5 percent by weight to about 40 percent by weight of the quantum dots;
about 0.5 percent by weight to about 35 percent by weight of the binder;
about 0.5 percent by weight to about 30 percent by weight of the photopolymerizable monomer;
about 0.01 percent by weight to about 10 percent by weight of the photoinitiator; and
a balance amount of the solvent.

12. The photosensitive composition of claim 1, which further comprises a thiol compound represented by Chemical Formula 5:

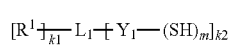

Chemical Formula 5 wherein in Chemical Formula 5,
$R^1$ is selected from hydrogen, a substituted or unsubstituted C1 to C30 linear or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are each independently hydrogen or a C1 to C30 linear or branched alkyl group), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted alkylene group and X is a halogen), —C(=O)OR' (wherein R' is hydrogen or a C1 to C20 linear or branched alkyl group), —CN, or —C(=O)ONRR' (wherein R and R' are each independently hydrogen or a C1 to C20 linear or branched alkyl group),
$L_1$ is a carbon atom, a substituted or unsubstituted C1 to C30 alkylene group, a substituted or unsubstituted C6 to C30 cycloalkylene group, a substituted or unsubstituted C6 to C30 arylene group, or a substituted or unsubstituted C6 to C30 heteroarylene group, wherein at least one methylene (—$CH_2$—) groups of the substituted or unsubstituted C1 to C30 alkylene group is optionally replaced by a sulfonyl group (—$SO_2$—), a carbonyl group (CO), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or a combination thereof,
$Y_1$ is a single bond, a substituted or unsubstituted C1 to C30 alkylene group, a substituted or unsubstituted C2 to C30 alkenylene group, a C1 to C30 alkylene group or a C2 to C30 alkenylene group wherein at least one methylene (—$CH_2$—) group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof,
m is an integer of 1 or more,
k1 is 0 or an integer of 1 or more,
k2 is an integer of 1 or more, and
the sum of m and k2 is an integer of 3 or more,
provided that m does not exceed the valence of $Y_1$ when $Y_1$ is not a single bond and provided that the sum of k1 and k2 does not exceed the valence of $L_1$.

13. A method of producing a photosensitive composition of claim 1, which comprises:
providing a binder solution comprising the binder and the solvent;
combining the plurality of quantum dots, wherein the quantum dot comprises an organic ligand bound to a surface of the quantum dot, with the binder solution to obtain a quantum dot-binder dispersion; and
combining the quantum dot-binder dispersion with at least one selected from the photopolymerizable monomer, the photoinitiator, and the solvent.

14. The photosensitive composition of claim 1, wherein the amount of the quantum dot is greater than or equal to about 10 wt % based on a total amount of the composition.

15. The photosensitive composition of claim 1,
wherein the amount of the plurality of quantum dots including the organic ligand is greater than 11110 weight percent based on a total amount of the composition.

16. The photosensitive composition of claim 1,
wherein the backbone structure comprises a structural unit represented by Chemical Formula 1:

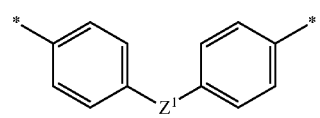

Chemical Formula 1 wherein in Chemical Formula 1,
* indicates a portion linked to an adjacent atom of the main chain of the binder,
$Z^1$ is a linking moiety represented by Chemical Formula 1-1, wherein in Chemical Formulae 1-1:

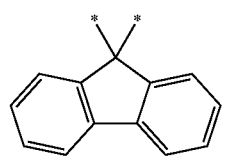

Chemical Formula 1-1

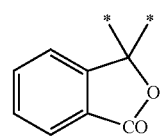

Chemical Formula 1-2

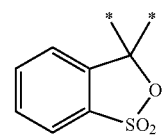

Chemical Formula 1-3

Chemical Formula 1-4

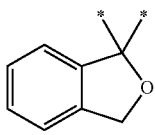

Chemical Formula 1-5

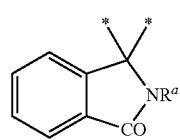

and, wherein the multiple aromatic ring-containing polymer comprises a functional group represented by Chemical Formula 4 at one or both terminal ends:

Chemical Formula 4

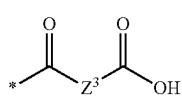

wherein in Chemical Formula 4, $Z^3$ is a moiety represented by one of Chemical Formulae 4-1, 4-2, and 4-4 to 4-7:

Chemical Formula 4-1

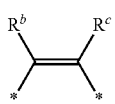

wherein in Chemical Formula 4-1, each of $R^b$ and $R^c$ is independently hydrogen, a substituted or unsubstituted C1 to C20 alkyl group, a C2 to C20 ester group, or a C2 to C20 ether group, Chemical Formula 4-2

Chemical Formula 4-4

Chemical Formula 4-5

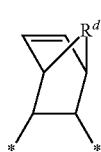

wherein in Chemical Formula 4-5, $R^d$ is O, S, NH, a substituted or unsubstituted C1 to C20 alkylene group, a C1 to C20 alkylamine group, or a C2 to C20 alkenylamine group, Chemical Formula 4-6

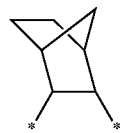

Chemical Formula 4-7

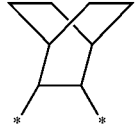

17. A quantum dot-polymer composite pattern comprising:
a plurality of quantum dots, wherein the quantum dot comprises an organic ligand on a surface of the quantum dot;
a binder; and
a polymerization product of a photopolymerizable monomer comprising a carbon-carbon double bond,
wherein the binder comprises a multiple aromatic ring-containing polymer comprising a carboxylic acid group and a main chain comprising a backbone structure incorporated in the main chain, wherein the backbone structure comprises a quaternary carbon atom, which is a part of a cyclic group, and two aromatic rings bound to the quaternary carbon atom, wherein the backbone structure of the multiple aromatic ring-containing polymer comprises a structural unit represented by Chemical Formula 1:

Chemical Formula 1

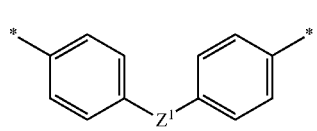

wherein in Chemical Formula 1,

\* indicates a portion linked to an adjacent atom of the main chain of the binder, $Z^1$ is a linking moiety represented by any one of Chemical Formulae 1-1 to 1-6, wherein in Chemical Formulae 1-1 to 1-6, and \* indicates a portion linked to an aromatic moiety:

Chemical Formula 1-1

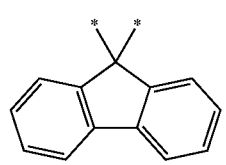

Chemical Formula 1-2

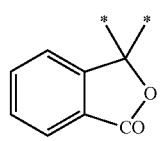

-continued

Chemical Formula 1-3

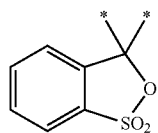

Chemical Formula 1-4

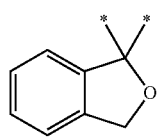

Chemical Formula 1-5

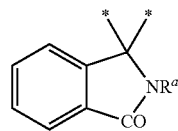

wherein in Chemical Formula 1-5,
$R^a$ is hydrogen, —$C_2H_5$, —$C_2H_4Cl$, —$C_2H_4H$, —$CH_2CH$=$CH_2$, or a phenyl group, Chemical Formula 1-6

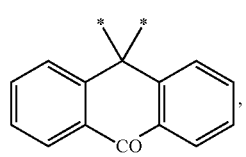

wherein the multiple aromatic ring-containing polymer has an acid value of greater than or equal to about 50 milligrams of KOH per gram of the polymer;
wherein the plurality of quantum dots are dispersed in the binder and the polymerization product of the photopolymerizable monomer, and are configured to have a quantum yield of greater than or equal to about 60% in the quantum dot-polymer composite pattern as measured with irradiation with an excitation light,
wherein in the quantum dot polymer composite pattern the quantum dots are dispersed with a dispersed phase having a dimension of less than or equal to about 1 micrometer, and
wherein an amount of the plurality of quantum dots is greater than 5 weight percent based on a total amount of the composite.

18. The quantum dot-polymer composite pattern of claim 17, wherein the organic ligand comprises RCOOH, $RNH_2$, $R_2NH$, $R_3N$, RSH, $R_3PO$, $R_3P$, ROH, RCOOR', $RPO(OH)_2$, $R_2POOH$ (wherein R and R' are each independently a C5 to C24 aliphatic hydrocarbon group or a C6 to C20 aromatic hydrocarbon group), a polymeric organic ligand, or a combination thereof.

19. The quantum dot-polymer composite pattern of claim 17, wherein the quantum dot comprises a Group II-VI compound, a Group III-V compound, a Group IV-VI compound, a Group IV element or compound, a Group I-III-VI compound, a Group I-II-IV-VI compound, or a combination thereof.

20. The quantum dot-polymer composite pattern of claim 17, wherein the multiple aromatic ring-containing polymer comprises a structural unit represented by Chemical Formula 2:

Chemical Formula 2

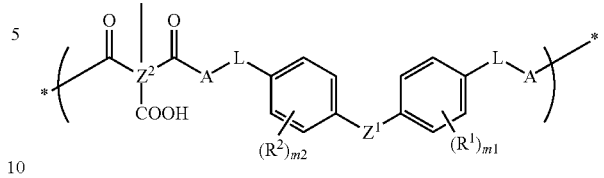

wherein in Chemical Formula 2,
$Z^1$ is a linking moiety represented by any one of Chemical Formulae 1-1 to 1-6,
L is a single bond, a C1 to C10 alkylene, a C1 to C10 alkylene comprising a substituent comprising a carbon-carbon double bond, a C1 to C10 oxy alkylene group, or a C1 to C10 oxy alkylene group comprising a substituent comprising a carbon-carbon double bond,
A is —NH—, —O—, or a C1 to C10 alkylene group, and
$Z^2$ is a C6 to C40 aromatic organic group.

21. The quantum dot-polymer composite pattern of claim 20, wherein in Chemical Formula 2,
$Z^2$ is selected from a moiety represented by Chemical Formula 2-1, Chemical Formula 2-2, or Chemical Formula 2-3:

Chemical Formula 2-1

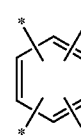

wherein in Chemical Formula 2-1,
* indicates a portion that is linked to an adjacent carbonyl carbon atom, Chemical Formula 2-2

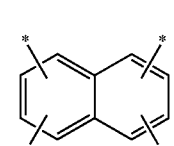

wherein in Chemical Formula 2-1,
* indicates a portion linked to an adjacent carbonyl carbon atom, Chemical Formula 2-3

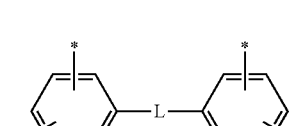

wherein in Chemical Formula 2-2,
* indicates a portion that is linked to an adjacent carbonyl carbon atom, L is a single bond, —O—, —S—, —C(=O)—, —CH(OH)—, —S(=O)$_2$—, —Si(CH$_3$)$_2$—, (CH$_2$)$_p$ (wherein 1≤p≤10), (CF$_2$)$_q$ (wherein 1≤q≤10), —CR$_2$— (wherein each R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

22. The quantum dot-polymer composite pattern of claim 17, wherein the multiple aromatic ring-containing polymer comprises a structural unit represented by Chemical Formula 3:

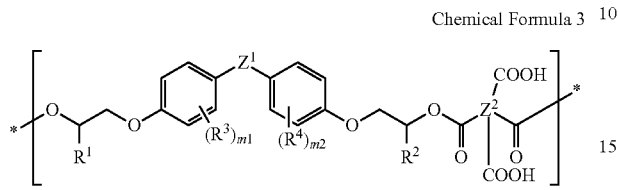

Chemical Formula 3 wherein in Chemical Formula 3,
each of R$^1$ and R$^2$ is independently hydrogen or a substituted or unsubstituted (meth)acryloyloxyalkyl group (wherein "alkyl" is a C1 to C20 alkyl group),
each of R$^3$ and R$^4$ is independently hydrogen, a halogen, or a substituted or unsubstituted C1 to C20 alkyl group,
Z$^1$ is independently a moiety selected from linking moieties represented by Chemical Formulae 1-1 to 1-6,
Z$^2$ is an aromatic organic group as defined in Chemical Formula 2, and
m1 and m2 are independently an integer ranging from 0 to 4.

23. The quantum dot-polymer composite pattern of claim 17, wherein the multiple aromatic ring-containing polymer comprises a functional group represented by Chemical Formula 4 at one or both terminal ends:

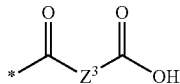

Chemical Formula 4 wherein in Chemical Formula 4,
Z$^3$ is a moiety represented by one of Chemical Formulae 4-1 to 4-7:

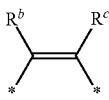

Chemical Formula 4-1 wherein in Chemical Formula 4-1,
each of R$^b$ and R$^c$ is independently hydrogen, a substituted or unsubstituted C1 to C20 alkyl group, a C2 to C20 ester group, or a C2 to C20 ether group,

Chemical Formula 4-2

Chemical Formula 4-3

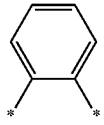

Chemical Formula 4-4

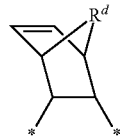

Chemical Formula 4-5 wherein in Chemical Formula 4-5,
R$^d$ is O, S, NH, a substituted or unsubstituted C1 to C20 alkylene group, a C1 to C20 alkylamine group, or a C2 to C20 alkenylamine group.

24. The quantum dot-polymer composite pattern of claim 17, wherein a weight average molecular weight of the multiple aromatic ring-containing polymer is greater than or equal to about 1,000 grams per mole and less than or equal to about 50,000 grams per mole.

25. A color filter comprising a quantum dot-polymer composite pattern of claim 17.

26. A photosensitive composition comprising:
a quantum dot dispersion comprising a binder and a plurality of quantum dots dispersed in the binder, wherein in the photosensitive composition the plurality of quantum dots are configured to have a quantum yield of greater than or equal to about 60% as measured with irradiation of an excitation light, and the quantum dots comprise an organic ligand bound to a surface of the quantum dot, and wherein the organic ligand comprises RCOOH, RNH$_2$, R$_2$NH, R$_3$N, RSH, R$_3$P, ROH, RCOOR', RPO(OH)$_2$, R$_2$POOH (wherein R and R' are each independently a C5 to C24 aliphatic hydrocarbon group or a C6 to C20 aromatic hydrocarbon group), a polymeric organic ligand, or a combination thereof;
a photopolymerizable monomer comprising a carbon-carbon double bond; and
a photoinitiator,
wherein the binder comprises a multiple aromatic ring-containing polymer comprising a carboxylic acid group and a main chain comprising a backbone structure incorporated in the main chain, wherein the backbone structure comprises a quaternary carbon atom, which is a part of a cyclic group, and two aromatic rings bound to the quaternary carbon atom, wherein the backbone structure of the multiple aromatic ring-containing polymer comprises a structural unit represented by Chemical Formula 1:

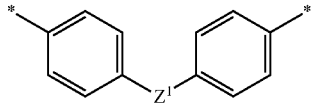

Chemical Formula 1 wherein in Chemical Formula 1,

* indicates a portion linked to an adjacent atom of the main chain of the binder, $Z^1$ is a linking moiety represented by any one of Chemical Formulae 1-1 to 1-6, wherein in Chemical Formulae 1-1 to 1-6, and

* indicates a portion linked to an aromatic moiety:

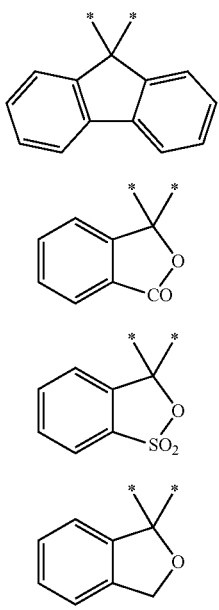

Chemical Formula 1-1

Chemical Formula 1-2

Chemical Formula 1-3

Chemical Formula 1-4

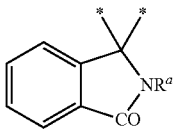

Chemical Formula 1-5 wherein in Chemical Formula 1-5,
$R^a$ is hydrogen, $-C_2H_5$, $-C_2H_4Cl$, $-C_2H_4OH$, $-CH_2CH=CH_2$, or a phenyl group,

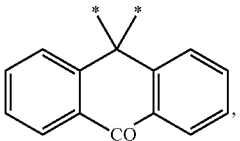

Chemical Formula 1-6 wherein the multiple aromatic ring-containing polymer has an acid value of greater than or equal to about 50 milligrams of KOH per gram of the polymer, wherein the photosensitive composition is a colloidal dispersion having a dispersed phase with a dimension of less than or equal to about 1 micrometer, and wherein an amount of the plurality of quantum dots including the organic ligand is greater than 5 weight percent based on a total amount of the composition.

27. The photosensitive composition of claim 26, wherein substantially all dispersed phases of the colloidal dispersion have a dimension of less than or equal to about 1 micrometer.

* * * * *